US012578290B2

(12) United States Patent
Yang et al.

(10) Patent No.: US 12,578,290 B2
(45) Date of Patent: Mar. 17, 2026

(54) FIRST HALF ECHO INCLUSION IN NUCLEAR MAGNETIC RESONANCE DATA

(71) Applicant: Halliburton Energy Services, Inc., Houston, TX (US)

(72) Inventors: Jie Yang, Houston, TX (US); Rebecca Jachmann, Houston, TX (US); Boguslaw Wiecek, Kingwood, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 167 days.

(21) Appl. No.: 18/645,695

(22) Filed: Apr. 25, 2024

(65) Prior Publication Data

US 2025/0334532 A1      Oct. 30, 2025

(51) Int. Cl.
| | |
|---|---|
| *G01N 24/08* | (2006.01) |
| *G01R 33/44* | (2006.01) |
| *G01R 33/46* | (2006.01) |
| *G01V 3/32* | (2006.01) |

(52) U.S. Cl.
CPC ......... *G01N 24/081* (2013.01); *G01R 33/448* (2013.01); *G01R 33/4625* (2013.01); *G01V 3/32* (2013.01)

(58) Field of Classification Search
CPC ............................... G01N 24/081; G01V 3/32
USPC ......................................................... 324/303
See application file for complete search history.

(56) References Cited

U.S. PATENT DOCUMENTS

| | | | |
|---|---|---|---|
| 6,570,382 B1 * | 5/2003 | Hurlimann | ........... G01N 24/081 |
| | | | 324/306 |
| 10,197,698 B2 | 2/2019 | Reiderman et al. | |
| 2016/0018555 A1 | 1/2016 | Jachmann et al. | |
| 2016/0077183 A1 | 3/2016 | Jachmann et al. | |
| 2016/0334533 A1 | 11/2016 | Coman et al. | |
| 2020/0018148 A1 | 1/2020 | Ramirez et al. | |
| 2023/0384472 A1 | 11/2023 | Reiderman et al. | |

OTHER PUBLICATIONS

International Search Report & Written Opinion; PCT Application No. PCT/US2024/031263; mailed Jan. 15, 2025.

* cited by examiner

*Primary Examiner* — Roberto Velez
(74) *Attorney, Agent, or Firm* — NOVAK DRUCE CARROLL LLP

(57) ABSTRACT

Systems and techniques are provided for determining a time zero echo of a nuclear magnetic resonance (NMR) sequence. An example method includes obtaining, via an NMR tool in a borehole, echo waveforms associated with refocusing pulses and a free induction decay (FID) waveform associated with an excitation pulse; determining echo values based on the echo waveforms and an apparent time-zero echo value based on the FID waveform, the apparent time-zero echo value representing a time zero echo; applying a correction factor to the apparent time-zero echo value to yield a corrected time zero echo value; and determining a spectrum associated with a sample based on an inversion performed on the corrected time zero echo values and the set of echo values before or after a conversion of the corrected time zero echo value and the set of echo values to porosity units, the conversion of the corrected time zero echo value and the set of echo values being based on one or more conversion factors.

20 Claims, 9 Drawing Sheets

600

Obtain, Via A Nuclear Magnetic Resonance (NMR) Tool In A Borehole, A Sequence of Waveforms Including A Set Of Echo Waveforms Associated With Refocusing Pulses Generated By The NMR Tool And A Free Induction Decay (FID) Waveform Associated With An Excitation Pulse Generated By The NMR Tool
602

Determine A Set Of Echo Values Based On The Set Of Echo Waveforms
604

Determine, Based On The FID Waveform, An Apparent Time-Zero Echo Value Representing An Echo At Time Zero Of A Time Domain
606

Apply A Correction Factor To The Apparent Time-Zero Echo Value To Yield A Corrected Time Zero Echo Value
608

Determine A Spectrum Associated With A Sample Based On An Inversion Performed On The Corrected Echo Value And The Set Of Echo Values Before Or After A Conversion Of The The Corrected Echo Value And The Set Of Echo Values To Porosity Units
610

205

250

252A

254

264

256

266B 266A $\vec{B}_{RF1}$ $\vec{B}_{RF2}$

262A

258

$\vec{B}_0$

262B

260

252B

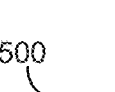

500

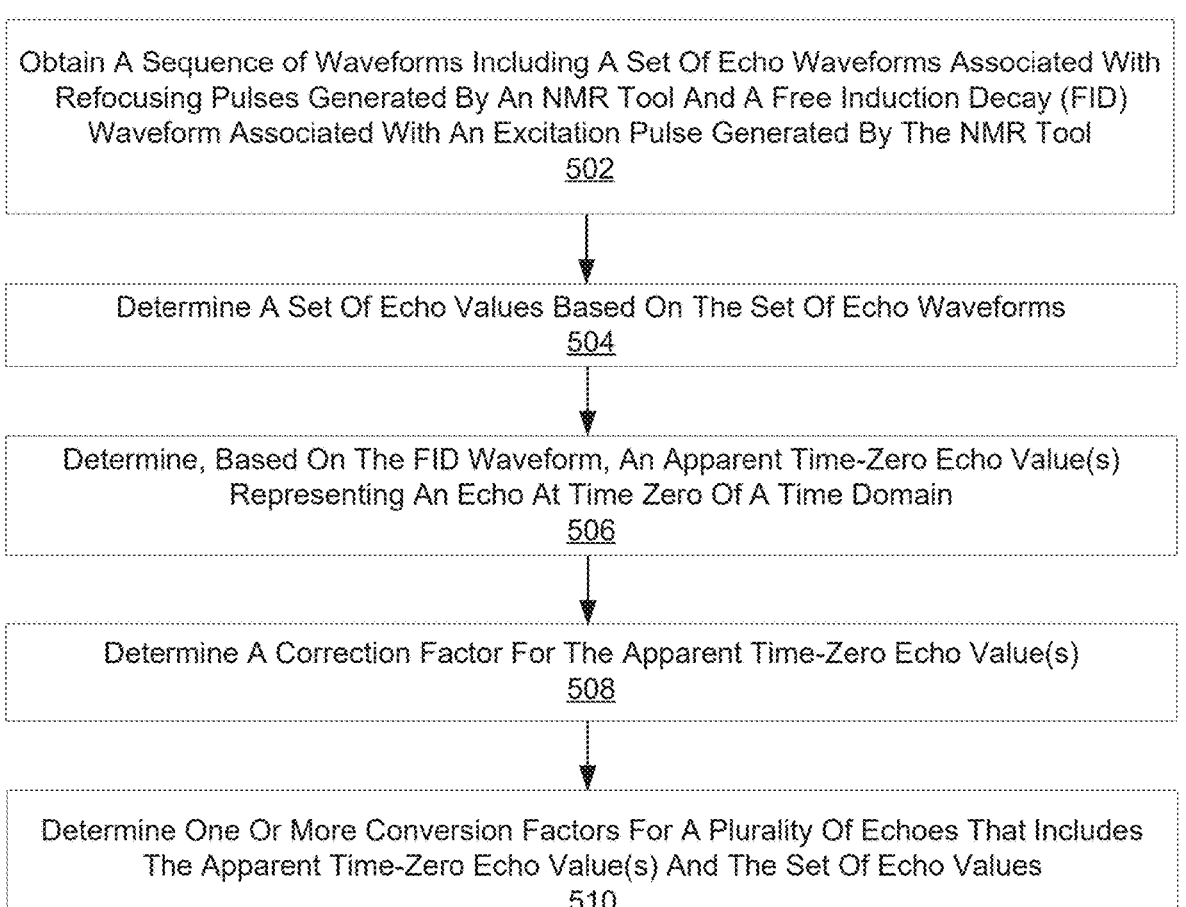

Obtain A Sequence of Waveforms Including A Set Of Echo Waveforms Associated With Refocusing Pulses Generated By An NMR Tool And A Free Induction Decay (FID) Waveform Associated With An Excitation Pulse Generated By The NMR Tool
502

Determine A Set Of Echo Values Based On The Set Of Echo Waveforms
504

Determine, Based On The FID Waveform, An Apparent Time-Zero Echo Value(s) Representing An Echo At Time Zero Of A Time Domain
506

Determine A Correction Factor For The Apparent Time-Zero Echo Value(s)
508

Determine One Or More Conversion Factors For A Plurality Of Echoes That Includes The Apparent Time-Zero Echo Value(s) And The Set Of Echo Values
510

Obtain, Via A Nuclear Magnetic Resonance (NMR) Tool In A Borehole, A Sequence of Waveforms Including A Set Of Echo Waveforms Associated With Refocusing Pulses Generated By The NMR Tool And A Free Induction Decay (FID) Waveform Associated With An Excitation Pulse Generated By The NMR Tool
602

Determine A Set Of Echo Values Based On The Set Of Echo Waveforms
604

Determine, Based On The FID Waveform, An Apparent Time-Zero Echo Value Representing An Echo At Time Zero Of A Time Domain
606

Apply A Correction Factor To The Apparent Time-Zero Echo Value To Yield A Corrected Time Zero Echo Value
608

Determine A Spectrum Associated With A Sample Based On An Inversion Performed On The Corrected Echo Value And The Set Of Echo Values Before Or After A Conversion Of The The Corrected Echo Value And The Set Of Echo Values To Porosity Units
610

FIG. 6

FIRST HALF ECHO INCLUSION IN NUCLEAR MAGNETIC RESONANCE DATA

TECHNICAL FIELD

The present disclosure generally relates to downhole nuclear magnetic resonance ("NMR") processing and interpretation. For example, aspects of the present disclosure relate to systems and techniques for determining an echo at time zero of an NMR sequence and using the time zero echo to process and interpret downhole NMR data.

BACKGROUND

Various well operations, such as stimulation operations and drilling operations, include activities to measure formation properties using various tools and data. For example, NMR tools can be used to determine petrophysical characteristics of a sample based on the magnetic interactions with the sample. Some downhole NMR tools include a magnet assembly that produces a static magnetic field, and a coil assembly that generates radio frequency ("RF") pulses and detects magnetic resonance phenomena in the sample. Properties of the sample can be identified from the detected phenomena.

BRIEF DESCRIPTION OF THE DRAWINGS

Illustrative examples and aspects of the present application are described in detail below with reference to the following figures:

FIG. 5 is a flowchart illustrating an example calibration process for determining correction and conversion factors for correcting echo values associated with a nuclear magnetic resonance sequence and converting the echo values to porosity units, according to some examples of the present disclosure;

FIG. 6 is a flowchart illustrating an example process for determining echo values associated with a sample or volume and using the echo values to determine a spectrum associated with the sample or volume, according to some examples of the present disclosure.

DETAILED DESCRIPTION

Figure 1A:
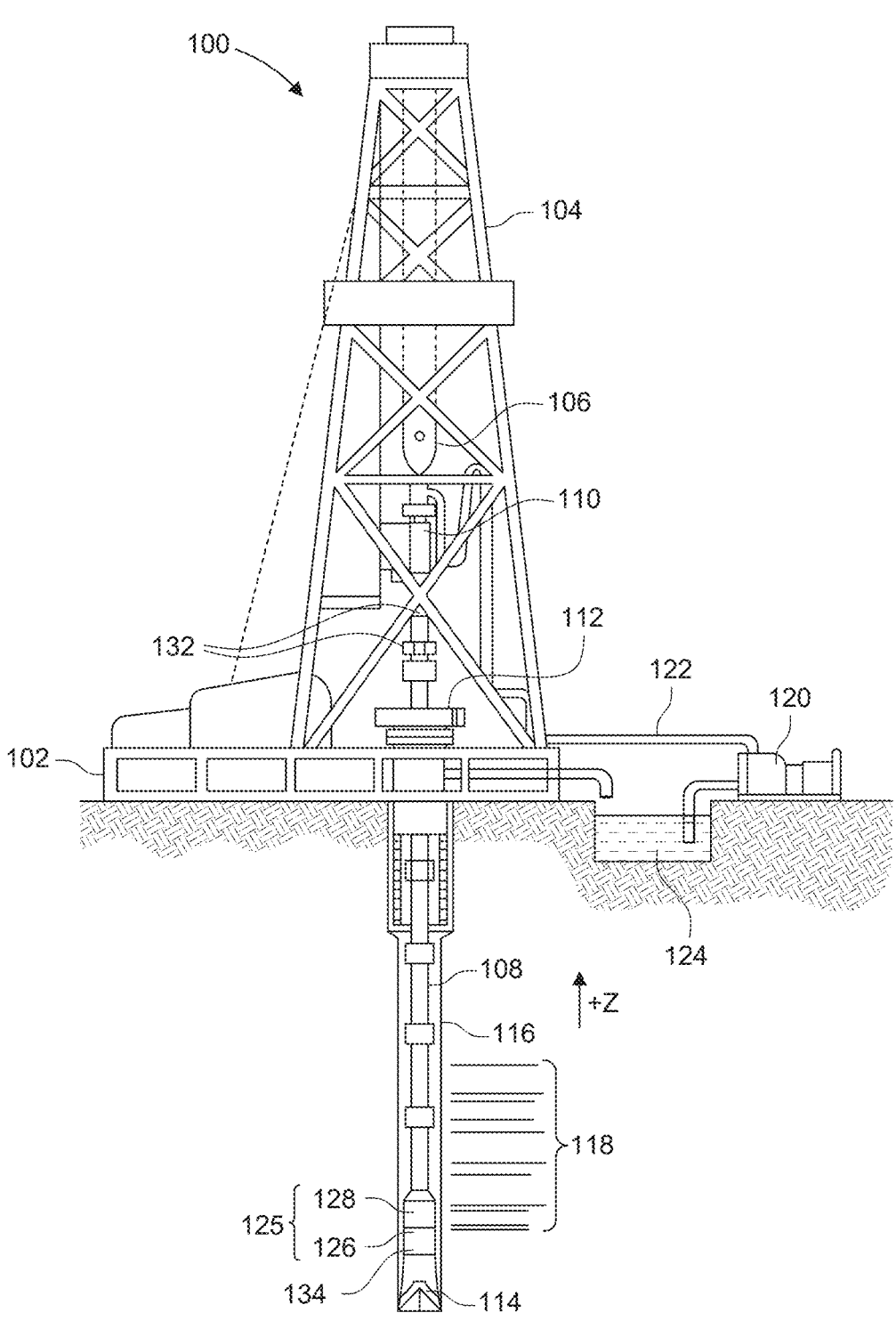
FIG. 1A is a schematic side-view of an example wireline logging environment, according to some examples of the present disclosure.

Various aspects and examples of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one embodiment or an embodiment, one aspect or an aspect, or one example or an example in the present disclosure can refer to the same embodiment/example/aspect/etc., or any embodiment/example/aspect/etc., and such references mean at least one of the embodiments, examples, and/or aspects.

Moreover, reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Also, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, techniques, systems, apparatuses, methods (also referred to as processes herein), non-transitory computer-readable media, and their related results according to the examples and aspects of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Well operations, such as stimulation and/or drilling operations, can include activities to measure formation properties. For example, well operations can include obtaining nuclear magnetic resonance (NMR) measurements in one or more locations of a borehole. NMR equipment can be integrated in a tool(s) within a borehole of the formation, such as a wireline and/or drilling tool. NMR equipment can also be positioned above the formation to make surface measurements. An NMR measurement can be interpreted as a signal or set of signals from which measurements, such as NMR amplitudes and relaxation time distributions, can be determined.

In some examples, NMR can be used as a source-less indicator of porosity for underground measurements. An NMR signal can be measured by splitting energy levels of a non-zero nuclear spin. Once the energy levels are split, an oscillating electromagnetic (EM) secondary field (e.g., linear or circularly polarized) can be applied to the spins. A continuous wave (CW) and depression of the energy can be measured alternatively. In downhole applications, the secondary oscillating EM field can be pulsed, and the NMR signal received after the pulse.

A simple mental representation of a spin can be an arrow that indicates the direction of the spin's magnetic moment. A grouping of spins is called a magnetization. Local magnetization can be a group of spins in a small volume, whereas bulk magnetization is the accumulation of all spins. Magnetization, in equilibrium, is pointed along the same direction as a magnetic field, such as a magnetic field from a magnet on an NMR tool. This direction can be designated herein as a z direction, and is a relative local coordinate system. The spins from a quantum mechanical point of view are in different energy levels. For a simple ½ spin sample there are two energy levels. The spins have a tendency to gradually align towards the magnetic field, which would be the lowest energy level. The difference between the number of spins in energy levels in NMR is generally in parts-per-million. This means that out of a large number of spins, only a few spins may be effectively aligned with the magnetic field once equilibrium is reached. The other spins may be misaligned and cancel out any observable effects once they are averaged. The time of alignment of the spins to the magnetic field can be quantified with a time constant, $T_1$ (e.g., longitudinal relaxation), which refers to the mean time for nuclear spins to return to their thermal equilibrium state. In some cases, the spins for an experiment may be given time to become fully aligned with the magnetic field, or in other cases only partially aligned before the spins are pulsed on. The alignment with the magnetic field is sometimes referred to as being polarized or polarization level.

A pulse can influence a spin when the spin is in a location where there is a part of the oscillating EM field ($B_1$) perpendicular to the stationary field, and the frequency of the oscillating EM field ($B_1$) is matching the difference in spin energy levels caused by the magnetic field. The frequency needed for excitation of the oscillating EM field ($B_1$) can be calculated as follows $\omega = -\gamma B_0$, where $\omega$ is the frequency, $\gamma$ is the gyromagnetic ratio, and $B_0$ is the magnitude of the static magnetic field (e.g., the magnetic field from a magnet of the NMR tool) at the location of the spin. An NMR tool can apply various pulses to the sample/volume using one or more antennas. For example, an NMR tool can use an antenna to apply an excitation pulse that transitions spins from their equilibrium state to an excited state (e.g., a radio frequency (RF) pulse used to excite the spins). Moreover, excited magnetization lies along the plane that is perpendicular to the magnetic field's direction. The perpendicular plane can be referred to herein as the x-y plane.

A full excitation pulse can tip the spin from the z direction to the x-y plane. This transition can be referred to as a 90-degree pulse as it can tip the spin 90 degrees. On the other hand, if the pulse inverses the direction of the spin, the pulse is a 180-degree pulse. A pulse that specifically inverses a spin from +z to −z is called an inversion pulse, and a pulse that inverses a spin in the x-y plane is referred to as a recovery pulse. If a pulse has the ability to scatter the magnetization and effectively reduce it to zero, the pulse can be referred to as a nullification or scrambling pulse. Such a pulse maybe be said to be a saturation pulse.

A series of pulses with specific timing between them can be used to receive NMR data. The NMR signal observed after a pulse is referred to as the free induction decay (FID). The pulse sequence can be used to understand and/or interpret the NMR data. In laboratories, NMR can measure chemical shift spectra that resolves hyperfine interactions between different spin types, as they have low gradients. For downhole applications where the magnetic field may have a natural gradient, the NMR tool can be used to measure the relaxation times of polarization (e.g., reaching equilibrium with the magnetic field) $T_1$ and the decay time $T_2$ (e.g., transverse relaxation) where the precessing nuclei fall out of alignment with each other over time and gradually stop producing a signal.

In some examples, to measure a decay time $T_2$, an NMR tool can generate an excitation pulse followed by one or more refocusing pulses. This sequence is referred to as the Carr-Purcell-Meiboom-Gill (CPMG) pulse sequence. The timing between the refocusing pulses can be varied or kept the same. In some examples, the timing of the NMR sequence can include excitation-$T_E/2$-(refocusing pulse-$T_E$)$_n$, where $T_E$ is the echo time. An echo is the deconvoluted and integrated signal between refocusing pulses. The echo can be recorded as part of NMR data acquired downhole. In some cases, for the $T_1$ measurement, the sequence can start with an inversion or a saturation pulse followed by a wait time. After the wait time, a CMPG sequence can be implemented and the process repeated for different wait times allowing for differing polarizations of the magnetization to be measured.

Spins can precess around the magnetic field that the spins experience. In some examples, the spins can be excited by an oscillating EM field to align the spins parallel to the directions of the magnetizing field of the NMR tool. The FID signal can be associated with an induced current in the antenna while the spins precess and gradually lose coherence and strength (e.g., due to magnetic field gradients or interactions with other spins). The shape of the FID can be referred to as the FID waveform or waveform envelope. The FID following a 90-degree pulse can start with a maximal amplitude and gradually drop off. The relaxation of the FID can be related to the coherence and magnitude of the spins. If the spins only decay due to the atomic molecular interaction, the $T_2$ decay can be an intrinsic decay. The actual observed decay time of the observed NMR signal, $T_2^*$, can additionally include decoherence due to magnetic field inhomogeneity, magnetic susceptibilities, diffusion, and/or solid-like behavior of the sample.

A magnetic field having a gradient (e.g., and thus a continuum of frequencies) can cause the signal to decay. Here, the excited spins have magnitude in the XY plane, but become unaligned (or decoherent) due to the gradient field causing a variation in precession frequency. The refocusing pulse flips the phases of the spins which then will gradually point back together before dispersing again. The loss of coherence due to the gradient is known as a recoverable loss of the signal. For the FID following a recovery pulse, the waveform can be similar to that of an acoustic echo, and thus can be referred to as an echo (E). In a gradient field, the proton spectrum can be smeared out and information about the hyperfine chemical shifts may in some cases not be gained by performing a Fourier transform to the echo waveform. However, the relaxation measurements can be used to obtain information.

In some examples, to obtain a $T_2$ intrinsic measurement, the coherence may be recovered using a recovery pulse. The recovery pulse inverses the phases of the spins where the faster and slower ones will be in opposite positions. The inversion allows the spins to realign after losing coherence. To gain the relaxation time, the peak signal from each echo can be tracked for loss. However, as the measurement inherently has a low signal-to-noise (SNR) ratio, the echo waveform can be integrated into a point and called an echo. The accumulation of echoes of the sequence can be referred to as an echo train. The echo train can be inverted to a relaxation time domain that can be used to derive various interpretations such as, for example and without limitation, porosity, pore size distribution, oil-gas ratio, permeability, etc.

The antenna and magnetic fields associated with an NMR tool can cause a more limited type of NMR data that can be measured downhole (as opposed to other use cases), particularly for drilling tools. For example, following an excitation pulse, the spins may be tipped in the transverse plane. There, the spins precess resulting in FID in the antenna. However, in some cases, limitations of downhole applications may prevent the FID to be measured directly after the excitation pulse. The stronger pulse needed to excite the formation's spins can have a non-instantaneous ringdown time. Opening the gate to read the signal directly after the pulse can result in measuring a signal called ringing from the residual energy of the pulse, in addition to signal from the spins. The signal from the residual energy of the pulse (e.g., the ringing) can prevent the NMR system from identifying the signal from the spins.

The first echo from an NMR sequence is generally observed at time $T_E$ (echo time), and can be referred to as an echo at time one or $E_1$. The challenges of measuring the FID after the excitation pulse is the ringing experienced by the excitation pulse generating antenna can prevent the NMR tool from obtaining NMR data at lower observation times (e.g., before time $T_E$), such as signal between the excitation pulse and recovery pulse, the FID. This FID could represent an apparent time-zero echo (also referred to as $E_0$) of the NMR sequence (e.g., during the excitation pulse, at the end of the excitation pulse, or significantly close in time to the end of the excitation pulse). The FID used to calculate the value referred to as $E_0$ is not an NMR echo, but the value can still be used in an echo train. As such it appears in the echo train data set as an echo would and thus has been designated herein as an apparent echo. The limitation on the amount of time until an echo can be obtained can limit the amount of relevant information that can be gained from the NMR data, such as information about properties (e.g., porosity) of a sample, NMR spectra, etc. For example, the lower observation times can provide additional porosity data, including porosity information from times shorter than $T_E$. Therefore, the times between time zero and $T_E$ are generally empty in the reported spectrum, and below $T_E$ unobservable. This results in a loss of information, such as porosity information.

For example, any porosity that has short T2 such as kerogen or other solids/semi-solids may be missed by the NMR tool.

Described herein are systems, apparatuses, processes (also referred to as methods), and computer-readable media (collectively referred to as "systems and techniques") for calculating and calibrating an echo at time zero of an NMR sequence and using the echo at time zero ($E_0$) to process and interpret downhole NMR data (e.g., including the echo at time zero). In some examples, to increase the sensitivity of an NMR tool, the NMR tool can include a magnet assembly and two or more orthogonal antennas. The magnetic assembly or antenna assembly my include magnetically permeable material. The magnet assembly hence forth called the magnet can generate a static magnetic field, $B_0$, that causes NMR active spins to polarize. For example, the magnet can cause nuclear spins to build up into a cohesive magnetization. An excitation antenna in the NMR tool can be used to excite the spins using a radio frequency (RF) field, $B_1$, and another antenna can be used to receive/measure the NMR signal. The NMR signal can be received from a specific volume or sample based on the magnetic field configuration, the excitation duration of the pulse, and the frequency of the pulse. The signal might additionally be acquired on the excitation antenna. The second antenna might also be used for refocusing pulse in some uses.

As previously noted, the excitation antenna can experience noise (e.g., ringing) after generating the excitation pulse. The noise (e.g., ringing) can negatively impact that antenna's ability to detect the NMR signal after the excitation pulse (and/or within a period of time after the excitation pulse), which may be a very small signal. Accordingly, by using an antenna to excite the spins and another antenna(s) to receive the NMR signal, the NMR tool can rely on the antenna that was not used to generate the excitation pulse to detect the NMR signal and avoid the noise (e.g., ringing) encountered by the excitation antenna. The antenna that was not used to generate the excitation pulse may not be affected (or minimally affected) by the noise (e.g., ringing) experienced by the antenna used to generate the excitation pulse, and thus can detect (with higher precision/sensitivity) an NMR signal at a time(s) when the antenna that generated the excitation pulse is affected by the noise (e.g., ringing).

In some examples, the NMR tool can use an antenna that was not used to generate the excitation pulse to measure the FID after the excitation pulse. For example, a first antenna of the NMR tool can generate the excitation pulse and a second antenna of the NMR tool can measure the FID after the excitation pulse. The FID after the excitation pulse may provide or represent a half echo at time zero (e.g., after or during the excitation pulse and before another pulse such as a refocusing pulse). The systems and techniques described herein can process the FID after the excitation pulse (e.g., the half echo) to construct a full echo at time zero.

In some cases, to calculate the effective time-zero echo, $E_0$, the systems and techniques described herein can first measure the FID after the excitation pulse. The value produced for time equals zero is not produced by an echo but the FID following the excitation pulse. Since the value calculated from the FID is used in some cases in an echo train it can represent an echo at time zero, and will henceforth be referred to as the time-zero echo. The systems and techniques described herein can deconvolute the FID signal and do a summation to generate a value representing $E_0$. In other cases, the systems and techniques described herein can construct the time-zero echo, $E_0$, using the excitation pulse FID and a relationship between the excitation pulse FID and an echo FID.

The systems and techniques described herein can also obtain an echo train. For example, the systems and techniques described herein can obtain an echo after each refocusing pulse to obtain echoes at times one through n (e.g., echoes $E_1$ to $E_n$). The systems and techniques described herein can use at least some of the echoes to generate a decay curve. For example, the systems and techniques described herein can fit at least a subset of the echoes to a decay curve. The subset of echoes will generally exclude echoes which need correcting factors, for example the first two echoes often need correction factors to be found prior to downhole use. In some examples, the systems and techniques described herein can do a linear fit using multiple echoes (excluding echoes at, for example, times one and time two, $E_1$ and $E_2$, which are often distorted as explained herein) or an exponential fit using all of the echoes with or without excluding one or more echoes, such as excluding the echoes at for example times one and time two, $E_1$ and $E_2$, which may be distorted. For example, when generating the decay curve, the systems and techniques described herein may use any of the echoes from the third echo, $E_3$, through the last echo, $E_n$, and ignore the echoes at time one and time two, $E_1$ and $E_2$. The $E_1$ and $E_2$ echoes can be ignored when generating the decay curve because such echoes are generally distorted. For example, $E_1$ and $E_2$ are often distorted as a result of a stimulated echo effect or other physics involved.

To correct $E_1$ and $E_2$, the systems and techniques described herein can compare the values of $E_1$ and $E_2$ with the projected values of $E_1$ and $E_2$ along the decay curve. The systems and techniques described herein can use the comparison to identify a correction factor that can be applied to the values of $E_1$ and $E_2$ in order to correct such values such that the $E_1$ and $E_2$ values are consistent with the values of such echoes within the decay curve. The corrected values of $E_1$ and $E_2$, referred to herein as $E_{c_1}$ and $E_{c_2}$, can then fall within the decay curve at their respective places in time and space. The systems and techniques described herein can also use the decay curve to project a value of $E_0$ to obtain a projected value called $A_0$. For example, the systems and techniques described herein can determine a correction factor for correcting $E_0$ based on the apparent time-zero value of $E_0$ and the projected value of $A_0$ along the decay curve, to obtain a corrected $E_0$ value referred to herein as Eco.

Moreover, the systems and techniques described herein can convert the echo values at times zero to n (e.g., $E_0$ through $E_n$ or $E_{c_0}$, $E_{c_1}$, $E_{c_2}$ until $E_{c_n}$ or $E_n$ depending on how many echoes need correction) to porosity units based on a conversion factor generated by comparing one or more of the echo signals to the signal of a sample having a certain porosity, such as water. The systems and techniques described herein can apply the conversion factor to the echoes before or after applying the correction factor to the distorted echoes and/or fitting the echoes to the decay curve.

In some examples, $E_0$, $E_{c_0}$, $E_{PU_0}$ (e.g., the time zero echo converted to porosity units) or $E_{cPU_0}$ (e.g., the time zero echo after being corrected and converted to porosity units) can be used to report a total porosity and/or can be placed into a full echo train as an echo at time zero and used to perform an inversion. With the NMR data including a time zero echo (e.g., $E_0$, $E_{c_0}$, $E_{PU_0}$ or $E_{cPU_0}$, which corresponds to (and/or represents) a time zero (or nearly time zero) relative to the excitation pulse and/or the NMR sequence echo), the systems and techniques described herein can obtain additional information, such as additional porosity information, and a lower portion of the spectra. In some examples, an inversion on the corrected echo at time zero (e.g., $E_{c_0}$) or the corrected echo at time zero converted to porosity units (e.g., $E_{cPU_0}$), as well as any other echoes in the echo train, can be used to determine a spectrum associated with a sample downhole (or any other sample), which can be used to evaluate petrophysical quantities in the sample. In some instances, downhole logging can measure, for example, the hydrogen containing fluid of a formation. The NMR tool may extract the fluid to measure it or may measure the formation outside of the NMR tool. Concepts herein may be applied to an NMR tool which extracts fluids or measures a formation outside of the tool, but the external measurement is provided herein as an example of how to receive NMR data.

When measuring the FID after the excitation pulse (e.g., the excitation FID) and determining the value of $E_0$ associated with the excitation FID, the systems and techniques described herein can implement any of a number of sequences. For example, in some cases, the systems and techniques described herein can perform a CPMG sequence. The CPMG sequence can use the excitation FID from a full polarized wait time or a partial recovery wait time. In another example, the systems and techniques described herein can implement a sequence that includes a 90(+x) pulse, followed by an FID measurement, followed by a 90(-x) pulse and a short (e.g., below a threshold amount of time) wait time (WT). The systems and techniques described herein can use the sequence to measure porosity via the excitation FID. In some cases, the sequence may have a fast repetition, where a 90-degree pulse is quickly (e.g., within a threshold amount of time) followed by a second 90-degree pulse before the signal completely decays. The systems and techniques described herein can allow a short WT for the magnetization to recover before starting the sequence again.

In yet another example, the systems and techniques described herein can implement a sequence involving a 90(+x) pulse, followed by an FID measurement, followed by a pulse at (TE/2)180(y), followed by a pulse at (TE/2)90(-x), and followed by a short WT (e.g., less than a threshold amount of time). The systems and techniques described herein can use the sequence to measure porosity via the excitation FID. In some cases, the sequence may have a fast repetition, where a 90-degree pulse is quickly followed by a recovery pulse with a TE/2 wait before and after the recovery pulse, and an excitation pulse having an opposing phase as the first excitation pulse. This allows full observation of the excitation FID and fast recovery of the magnetization.

In some examples, a $T_1$ experiment downhole can include flipping or nulling the magnetization in the positive z direction through an inversion, excitation, or saturation pulse followed by an NMR sequence, such as a Carl-Purcell-Meiboom-Gill (CPMG) sequence. The time between the saturation pulse and the NMR sequence (e.g., the CPMG sequence), which is designated as wait time (WT), can be varied in the t (time) domain. This allows for the built-up magnetization in the z-axis to be measured. Any number of wait times can be used.

Examples of the systems and techniques described herein are illustrated in FIG. 1A through FIG. 7 and described below.

FIG. 1A is a schematic diagram of an example logging while drilling wellbore operating environment, according to some examples of the present disclosure. The systems and techniques described herein can be implemented in a logging while drilling wellbore environment using an NMR tool as described herein.

The drilling arrangement shown in FIG. 1A provides an example of a logging-while-drilling (commonly abbreviated as LWD) configuration in a wellbore drilling scenario 100.

The LWD configuration can incorporate sensors (e.g., EM sensors, seismic sensors, gravity sensor, image sensors, etc.) that can acquire formation data, such as characteristics of the formation, components of the formation, etc. For example, the drilling arrangement shown in FIG. 1A can be used to gather formation data through an electromagnetic imager tool (not shown) as part of logging the wellbore using the electromagnetic imager tool. The drilling arrangement of FIG. 1A also exemplifies what is referred to as Measurement While Drilling (commonly abbreviated as MWD) which utilizes sensors to acquire data from which the wellbore's path and position in three-dimensional space can be determined. FIG. 1A shows a drilling platform 102 equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, it creates a wellbore 116 that passes through various subterranean formations 118. A pump 120 circulates drilling fluid through a supply pipe 122 to top drive 110, down through the interior of drill string 108 and out orifices in drill bit 114 into the wellbore. The drilling fluid returns to the surface via the annulus around drill string 108, and into a retention pit 124. The drilling fluid transports cuttings from the wellbore 116 into the retention pit 124 and the drilling fluid's presence in the annulus aids in maintaining the integrity of the wellbore 116. Various materials can be used for drilling fluid, including oil-based fluids and water-based fluids.

Logging tools 126 can be integrated into the bottom-hole assembly 125 near the drill bit 114. As drill bit 114 extends into the wellbore 116 through the formations 118 and as the drill string 108 is pulled out of the wellbore 116, logging tools 126 collect measurements relating to various formation properties as well as the orientation of the tool and various other drilling conditions. The logging tool 126 can be applicable tools for collecting measurements in a drilling scenario, such as the electromagnetic imager tools described herein. Each of the logging tools 126 may include one or more tool components spaced apart from each other and communicatively coupled by one or more wires and/or other communication arrangement. The logging tools 126 may also include one or more computing devices communicatively coupled with one or more of the tool components. The one or more computing devices may be configured to control or monitor a performance of the tool, process logging data, and/or carry out one or more aspects of the methods and processes of the present disclosure.

The bottom-hole assembly 125 may also include a telemetry sub 128 to transfer measurement data to a surface receiver 132 and to receive commands from the surface. In at least some cases, the telemetry sub 128 communicates with a surface receiver 132 by wireless signal transmission (e.g., using mud pulse telemetry, EM telemetry, or acoustic telemetry). In other cases, one or more of the logging tools 126 may communicate with a surface receiver 132 by a wire, such as wired drill pipe. In some instances, the telemetry sub 128 does not communicate with the surface, but rather stores logging data for later retrieval at the surface when the logging assembly is recovered. In at least some cases, one or more of the logging tools 126 may receive electrical power from a wire that extends to the surface, including wires extending through a wired drill pipe. In other cases, power is provided from one or more batteries or via power generated downhole.

Collar 134 is a frequent component of a drill string 108 and generally resembles a very thick-walled cylindrical pipe, typically with threaded ends and a hollow core for the conveyance of drilling fluid. Multiple collars 134 can be included in the drill string 108 and are constructed and intended to be heavy to apply weight on the drill bit 114 to assist the drilling process. Because of the thickness of the collar's wall, pocket-type cutouts or other type recesses can be provided into the collar's wall without negatively impacting the integrity (strength, rigidity and the like) of the collar as a component of the drill string 108.

Figure 1B:
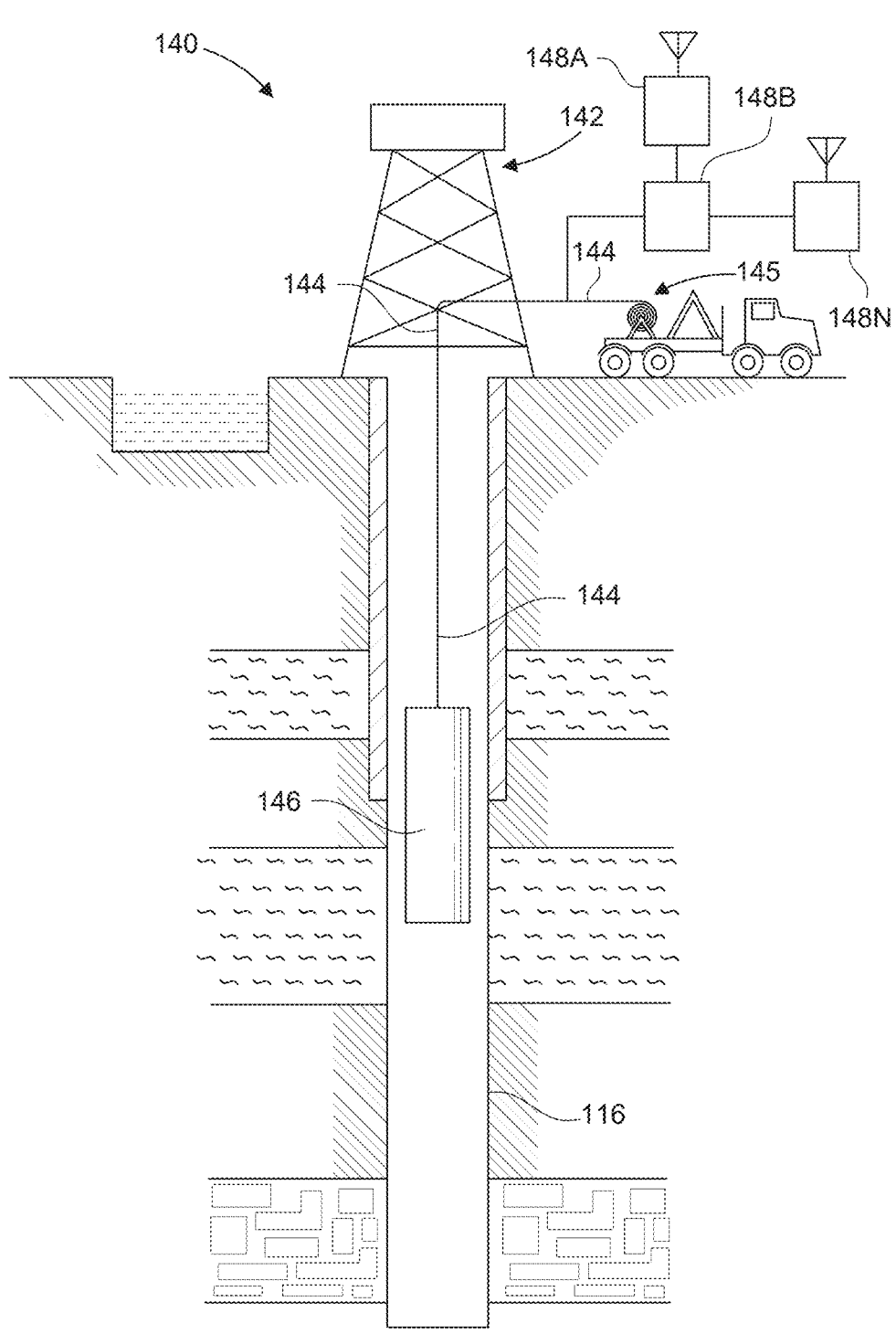
FIG. 1B is a schematic side-view of the example logging environment of FIG. 1A, according to some examples of the present disclosure.

FIG. 1B is a schematic diagram of an example downhole environment having tubulars, according to some examples of the present disclosure. The systems and techniques described herein can be implemented in the downhole environment using an NMR tool as described herein. In this example, an example system 140 is depicted for conducting downhole measurements after at least a portion of a wellbore has been drilled and the drill string removed from the well. An electromagnetic imager tool (not shown) can be operated in the example system 140 shown in FIG. 1B to log the wellbore. A downhole tool is shown having a tool body 146 in order to carry out logging and/or other operations. For example, instead of using the drill string 108 of FIG. 1A to lower the downhole tool, which can contain sensors and/or other instrumentation for detecting and logging nearby characteristics and conditions of the wellbore 116 and surrounding formations, a wireline conveyance 144 can be used. The tool body 146 can be lowered into the wellbore 116 by wireline conveyance 144. The wireline conveyance 144 can be anchored in the drill rig 142 or by a portable means such as a truck 145. The wireline conveyance 144 can include one or more wires, slicklines, cables, and/or the like, as well as tubular conveyances such as coiled tubing, joint tubing, or other tubulars. The downhole tool can include an applicable tool for collecting measurements in a drilling scenario, such as the electromagnetic imager tools described herein.

The illustrated wireline conveyance 144 provides power and support for the tool, as well as enabling communication between data processors 148A-N on the surface. In some examples, the wireline conveyance 144 can include electrical and/or fiber optic cabling for carrying out communications. The wireline conveyance 144 is sufficiently strong and flexible to tether the tool body 146 through the wellbore 116, while also permitting communication through the wireline conveyance 144 to one or more of the processors 148A-N, which can include local and/or remote processors. The processors 148A-N can be integrated as part of an applicable computing system, such as the computing device architectures described herein. Moreover, power can be supplied via the wireline conveyance 144 to meet power requirements of the tool. For slickline or coiled tubing configurations, power can be supplied downhole with a battery or via a downhole generator.

Figure 2A:
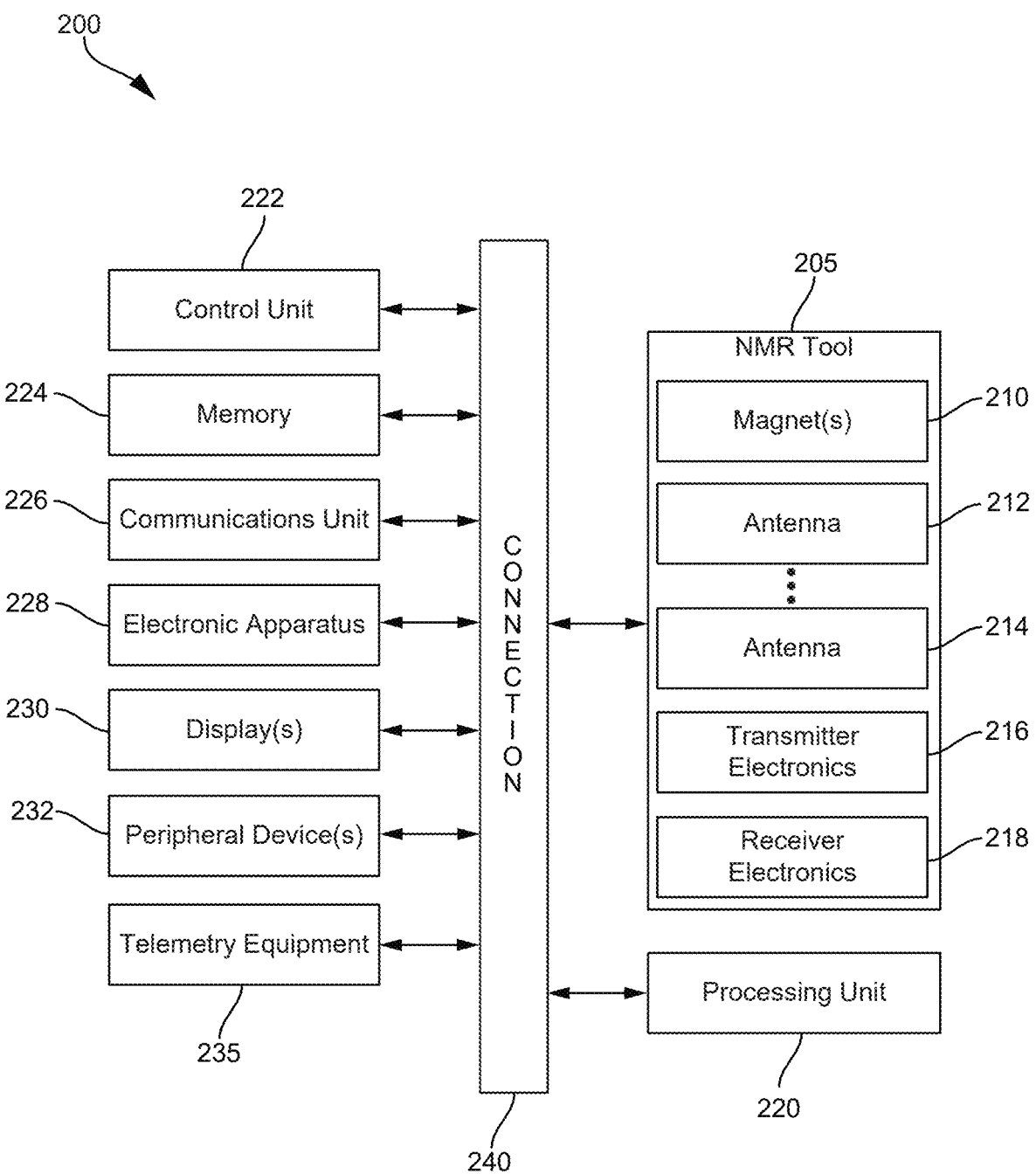
FIG. 2A is a block diagram illustrating an example system used to obtain and process nuclear magnetic resonance data, according to some examples of the present disclosure.

FIG. 2A is a block diagram illustrating an example system 200 that can be used to obtain and/or process nuclear magnetic resonance (NMR) data, according to some examples of the present disclosure. In this example, the system 200 can include an NMR tool 205 configured to obtain NMR data as further described herein. The NMR tool 205 can include a magnet(s) 210, an excitation antenna 212, a detection antenna 214, transmitter electronics 216, and receiver electronics 218. In some aspects, the NMR tool 205 can also include magnetically permeable material. In some cases, the magnet(s) 210 and/or antenna fields can also be created at least partly based on the magnetically permeable material.

In some examples, the NMR tool 205 can include other hardware components such as, for example and without limitation, a processing unit (e.g., processing unit 220), a control unit (e.g., control unit 222), memory (e.g., memory 224), a communications unit (e.g., communications unit 226), an electronic apparatus (e.g., electronic apparatus 228), telemetry equipment (e.g., telemetry equipment 235), and/or any other hardware component. Additional examples of hardware components that can be implemented by the NMR tool 205 and/or the system 200 are shown in FIG. 9 and further described herein with respect to FIG. 9. In some cases, the system 200 can include more or less components than the components shown in FIG. 2A, including a component(s) that is or is not shown in FIG. 2A. For example, the NMR tool 205 of the system 200 can include additional magnets, additional antennas, additional electronics, etc.

Moreover, the components of the system 200 (e.g., the NMR tool 205, processing unit 220, control unit 222, memory 224, communications unit 226, electronic apparatus 228, display(s) 230, peripheral device(s) 232, telemetry equipment 235) can be part of (e.g., implemented by and/or integrated in) a same device or multiple devices. For example, in some cases, a same electronic device can implement the NMR tool 205 and one or more other components of the system 200, such as the processing unit 220, the control unit 222, the memory 224, the communications unit 226, the electronic apparatus 228, the display(s) 230, the peripheral device(s) 232, and/or the telemetry equipment 235. In other cases, the NMR tool 205 and one or more other components of the system 200 (e.g., the processing unit 220, the control unit 222, the memory 224, the communications unit 226, the electronic apparatus 228, the display(s) 230, the peripheral device(s) 232, and/or the telemetry equipment 235) can be implemented by two or more separate and/or different devices.

The NMR tool 205 can be used to collect NMR data associated with a sample in a wellbore/borehole, such as a volume or formation in a wellbore/borehole. In some examples, the magnet 210 can generate a static magnetic field, $B_0$, that causes atoms with non-zero spin to magnetize. For example, the magnet 210 can generate a static magnetic field, $B_0$, that causes nuclear spins to build up into a cohesive magnetization. An excitation antenna 212 of the NMR tool 205 can be used to excite nuclear spins associated with the sample using a radio frequency (RF) field, $B_1$. Moreover, a detection antenna 214 of the NMR tool 205 can be used to receive and/or detect the NMR signal. The NMR signal can be received from a sample based withing the generated magnetic field (e.g., the static magnetic field from the magnet 210), the excitation duration of the excitation pulse from the excitation antenna 212, and/or the frequency of the excitation pulse.

The excitation antenna 212 can experience noise (e.g., ringing) after generating the excitation pulse. The noise (e.g., ringing) can negatively impact the ability of the excitation antenna 212 to detect an NMR signal, which may be a very small signal that decays with time. Accordingly, to avoid the negative impact of the noise experienced by the excitation antenna 212 after the excitation pulse on the ability to detect or measure the NMR signal, the NMR tool 205 can use the excitation antenna 212 to excite the spins and the detection antenna 214 (as opposed to the excitation antenna 212) to receive the NMR signal. This way, the NMR tool 205 can rely on the detection antenna 214, which was not used to generate the excitation pulse, to detect the NMR signal (as opposed to the excitation antenna 212) and avoid the noise (e.g., ringing) encountered by the excitation antenna 212. The detection antenna 214 may not be affected (or may be affected significantly less than the excitation antenna 212) by the noise (e.g., ringing) experienced by the excitation antenna 212 since the detection antenna 214 was not used to generate the excitation pulse and therefore should not encounter ringing caused by the excitation pulse. Thus, the detection antenna 214 can detect (with higher precision/sensitivity) an NMR signal at a time(s) when the excitation antenna 212 is affected by the noise (e.g., ringing) associated with the excitation pulse. In some examples, the excitation antenna 212 can become a recovery pulse antenna and collect data on one or more echoes, such as the first echo (e.g., the echo at time one) and any subsequent echo. In some cases, the detection antenna 214 may similarly be used for recovery pulses starting with the first echo and/or any subsequent echoes. Moreover, while the NMR tool 205 is shown with two antennas, in other cases, the NMR tool 205 may include one or more additional antennas, such as a third antenna, which can be used for any of the functionalities described herein with respect to the excitation antenna 212 and/or the detection antenna 214.

In some examples, the NMR tool 205 can use the detection antenna 214 to measure the free induction decay (FID) after the excitation pulse generated by the excitation antenna 212. For example, the excitation antenna 212 can generate the excitation pulse and the detection antenna 214 can measure the FID after the excitation pulse from the excitation antenna 212. The FID after the excitation pulse may provide or represent a half echo at time zero (e.g., after or during the excitation pulse and before another pulse such as a refocusing pulse), which can be designated $E_{h_0}$. The system 200 can process the FID after the excitation pulse (e.g., the half echo) to construct a full echo at time zero, as further described herein. The system 200 alternatively can process the FID after the excitation pulse (e.g., the half echo) and correct the echo at time zero, as further described herein.

In some aspects, the system 200 can include a processing unit 220, a control unit 222, a memory 224, a communications unit 226, an electronic apparatus 228, a display(s) 230, one or more peripheral devices 232, and/or telemetry equipment 235. The memory 224 can include any memory device(s) for storing data such as, for example and without limitation, a volatile memory device and/or a non-volatile memory device. The processing unit 220 can include one or more processing devices such as, for example and without limitation, a central processing unit (CPU), a graphics processing unit (GPU), a digital signal processor (DSP), a field-programmable gate array (FPGA), an application-specific integrated circuit (ASIC), a microprocessor, a microcontroller, a processor core, a system-on-chip (SOC), a memristor processing device, a neuromorphic chip, an intellectual property (IP) core and/or processor, and/or any other processing device. The processing unit 220 can be configured to process NMR data from the NMR tool 205, as further described herein. For example, the processing unit 220 can be configured to determine echo values based on waveforms detected by one or more antennas of the NMR tool 205, calculate a decay curve, calculate a correction factor(s) to correct distorted echoes, calculate a conversion factor for converting echo values into values in porosity units, calculate spectrum coefficients, determine petrophysical information of a sample based on NMR data, etc.

The control unit 222 can include one or more processing devices such as, for example and without limitation, a CPU, a GPU, a DSP, an FPGA, an ASIC, a microprocessor, a microcontroller, a processor core, an SOC, a memristor processing device, a neuromorphic chip, an IP core and/or processor, and/or any other processing device. In some cases, the control unit 222 can be configured to control operation of the transmitter electronics 216 and/or the receiver electronics 218, and/or perform operations on the signals collected by the receiver electronics 218 to process NMR data generated by the NMR tool 205. For example, in some cases, the control unit 222, the memory 224, and the communications unit 226 can be arranged to operate as a processing unit to control operation of the transmitter electronics 216 and/or the receiver electronics 218, and/or perform operations on the signals collected by the receiver electronics 218 to process NMR data generated by the NMR tool 205. In other cases, the processing unit 220 can additionally or alternatively be configured to control operation of the transmitter electronics 216 and/or the receiver electronics 218, and/or perform operations on the signals collected by the receiver electronics 218 to process NMR data generated by the NMR tool 205.

In some cases, the processing unit 220 and/or the control unit 222 can operate to control activation of the transmitter electronics 216 to generate echo train sequences and recovery pulses. The processing unit 220 and/or the control unit 222 can operate to control selection of the receiver electronics 218 in the NMR tool 205 and manage processing schemes. The processing unit 220, control unit 222, the memory 224, and other components of the system 200 can be structured, for example, to operate similar to or identical to the components discussed herein or similar to or identical to any methods discussed herein.

The system 200 can include a connection 240, such as a bus or communications link, which can provide electrical connectivity among the components of the system 200. In some examples, the system 200 can include one or more peripheral devices 232. The one or more peripheral devices 232 can include any peripheral devices such as, for example, input devices, output devices, etc. In some examples, the one or more peripheral devices 232 can include storage memory and/or other control devices that may operate in conjunction with the control unit 222 and/or the memory 224. In some cases, the control unit 222 can be realized as a processor or a group of processors that may operate independently depending on an assigned function.

In some aspects, the telemetry equipment 235 can communicate via the connection 240 with other components such as, for example, the communications unit 226, other components of the system 200, and/or a remote device(s). Components of the system 200 can be implemented as single units or distributed among multiple components of the system 200, such as the electronic apparatus 228. The components shown in FIG. 2A need not be distributed as shown. Some of the components may be located on the surface, in the NMR tool 205, in other locations in a logging tool, drill string, wireline logging tool, or some other location in the systems illustrated in FIGS. 1A and/or 1B.

Figure 2B:
FIG. 2B is a diagram illustrating an example of magnet and antenna assemblies of a nuclear magnetic resonance tool, according to some examples of the present disclosure.

FIG. 2B is a diagram illustrating an example of magnet and antenna assemblies of the NMR tool 205, according to some examples of the present disclosure. The example NMR tool 205 includes a magnet assembly 250 that generates a static magnetic field used to polarize spins, and an antenna assembly 260 that generates a radio frequency (RF) magnetic field to excite spins and acquire NMR signals. In this example, the magnet assembly 250 includes end piece magnets 252A and 252B and a central magnet 254 that generates the static magnetic field in a volume of investigation. In the volume of investigation, the direction of the static magnetic field (shown as the solid black arrow 258) associated with the central magnetic field area 206 can be parallel to the longitudinal axis of the wellbore. In some examples, a differing magnet configuration can be used such as the Jackson-jasper. Any magnet configuration could be considered, as long as there is an associated antenna configuration which is not parallel with the magnetic field.

The antenna assembly 260 can include at least two mutually orthogonal transversal-dipole antennas 210A and 210B. In some instances, the NMR tool 205 can be implemented with a single transversal-dipole antenna. For example, one of the transversal-dipole antennas 210A or 210B may be omitted from the antenna assembly 260. The example transversal-dipole antennas 210A and 210B shown in FIG. 2B are placed on an outer surface of a soft magnetic core 264, which can be used for RF magnetic flux concentration. The transversal-dipole antennas 210A and 210B can produce RF magnetic fields $B_{RF1}$ and $B_{RF2}$. The directions of the RF magnetic fields $B_{RF1}$ and $B_{RF2}$ in this area are shown at 266A and 266B, and direction of the static magnetic field $B_0$ in this area is shown at 258.

In some examples, the static magnetic field $B_0$ can be axially symmetric (or substantially axially symmetric), and therefore may not need broader band excitation associated with additional energy loss. A longer sensitivity region can enable measurement while tripping the drill string. The sensitivity region can be shaped by shaping the magnets 252A, 252B, 254 and the soft magnetic material of the core 212.

In some implementations, the antenna assembly 260 additionally or alternatively include an integrated coil set that performs the operations of the two transversal-dipole antennas 210A and 210B. For example, the integrated coil may be used (e.g., instead of the two transversal-dipole antennas 210A and 210B) to produce circular polarization and perform quadrature coil detection. Examples of integrated coil sets that can be adapted to perform such operations include multi-coil or complex single-coil arrangements, such as, for example and without limitation, birdcage coils often used for high-field magnetic resonance imaging (MRI).

In some aspects, NMR measurements over multiple subvolumes can increase the data density and therefore SNR per unit time. Multiple volume measurements in a static magnetic field having a radial gradient can be achieved, for example, by acquiring NMR data on a second frequency while waiting for nuclear magnetization to recover (e.g., after a pulse sequence such as a CPMG pulse train) on a first frequency. A number of different frequencies can be used to run a multi-frequency NMR acquisition involving a number of excitation volumes with a different depth of investigation. In addition to higher SNR, the multi-frequency measurements can enable profiling a fluid invasion in the wellbore, enabling a better assessment of permeability of earth formations. Another way to conduct multi-volume measurements is to use different regions of the magnet assembly to acquire an NMR signal. NMR measurements of these different regions can be run at the same time (e.g., simultaneously) or at different times.

In some aspects, a combination of transversal-dipole and monopole antennas can be used to enable unidirectional azimuthally-selective measurements, without substantially reducing SNR in some cases. In some examples, the NMR excitation can be substantially axially symmetrical (e.g., using either a transversal-dipole antenna or a monopole antenna) while a combination of axially-symmetrical sensitivity transversal-dipole antenna and axially-symmetrical sensitivity monopole antenna responses can enable azimuthally-resolved measurements.

Figure 3:
FIG. 3 is a diagram illustrating an example of a transverse relaxation (T2) nuclear magnetic resonance experiment, according to some examples of the present disclosure.

FIG. 3 illustrates an example NMR sequence that can be implemented by the NMR tool 205 to obtain NMR data, according to some examples of the present disclosure. In this example, the NMR sequence includes an excitation pulse 302 (e.g., generated by the excitation antenna 212 of the NMR tool 205) and a sequence of recovery (or refocusing) pulses 310 (e.g., generated by an antenna of the NMR tool 205, such as the excitation antenna 212). Some or all of the recovery pulses 310 can be the same or can differ in terms of frequency, phase, duration, energy, pattern, etc.

As shown in this example, the recovery pulses 310 can cause echo waveforms 312. The peak amplitudes of the echo waveforms 312 can be equally spaced apart by a peak-to-peak time distance, TE (echo time), that corresponds to the equally spaced apart time distances of the recovery pulses 310. Recovery pulses are not limited to the number of pulses shown in FIG. 3, as the number used may depend on the application and/or measurement parameters. The echo waveforms 312 can occur during acquisition windows when the signals of the echoes associated with the echo waveforms 312 can be captured by a detection device, such as the NMR tool 205. Moreover, the echo waveforms 312 can be used to obtain echo values (e.g., echo values 320 through 388), as described herein. In some examples, the NMR tool 205 of the system 200 can obtain an echo after each recovery (or refocusing) pulse 310 in the NMR sequence to obtain an echo train with echoes at times one through n (e.g., echo values 320 through 388 corresponding to echoes $E_1$ to $E_n$), where n is a number greater than 1. The system 200 can use at least some of the echoes to generate a decay curve, as described below.

As further explained herein, $A_0$ (e.g., echo value 330) can represent the projected amplitude of an echo at time zero along an exponential decay fitting curve 390. The decay curve 390 can be determined from a number of echoes, such as the third echo $E_3$ (e.g., echo value 336) to the last echo $E_n$ (e.g., echo value 388), that are measured by the NMR tool 205 based on respective echo waveforms (e.g., echo waveforms 312) caused by the recovery pulses 310. Moreover, $A_0$ is not measured but rather calculated using the exponential decay fitting curve 390. For example, $A_0$ can be calculated based on the decay curve 390 generated using the third echo, $E_3$ (e.g., 336), to the last echo $E_n$ (e.g., 388). In some examples, to derive $A_0$, the decay curve 390 can be used to project $A_0$ along time zero of the decay curve 390. As previously noted, the echoes $E_1$ and $E_2$ can be distorted when initially obtained. However, the echoes $E_1$ (e.g., echo value 320) and $E_2$ (e.g., echo value 322) can be included in the echo train (and the decay curve 390) if they are corrected.

For example, initially, the first echo value 320 and the second echo value 322 (e.g., $E_1$ and $E_2$, respectively) are generally distorted due to physics such as a stimulated echo effect or other physics involved. Accordingly, in some cases, the first echo value 320 and the second echo value 322 ($E_1$ and $E_2$,) prior to correction, may not be used to generate the decay curve 390. However, the decay curve 390 can be used to correct the first echo value 320 and the second echo value 322 ($E_1$ and $E_2$,). For example, the first echo value 320 and the second echo value 322 ($E_1$ and $E_2$,) can be compared to the echo values 332 and 334 of $A_1$ and $A_2$, respectively, along the projected decay curve 390 to determine a correction factor(s) that can be used to convert the first echo value 320 and the second echo value 322 ($E_1$ and $E_2$,) to the corrected first and second echo values, $E_{c_1}$ and $E_{c_2}$ respectively, which are thus fit along time one and time two of the decay curve 390. In FIG. 3, the first echo value 320 and the second echo value 322 ($E_1$ and $E_2$,) are shown as distorted and subsequently corrected. However, in other examples, other echoes may also be affected and corrected in a similar manner.

In some examples, the NMR tool 205 can use the detection antenna 214 to measure the FID after the excitation pulse 302 generated by the excitation antenna 212. For example, the excitation antenna 212 can generate the excitation pulse 302 and the detection antenna 214 can measure the FID after the excitation pulse 302 from the excitation antenna 212. The FID after the excitation pulse 302 may provide or represent a half echo at time zero (e.g., after or during the excitation pulse 302 and before another pulse such as a refocusing pulse), which can be designated $E_{h_0}$. In some cases, the FID after the excitation pulse 302 (e.g., the half echo) can be used to construct a full echo at time zero, such as $E_0$ (e.g., echo value 315). For example, the FID after the excitation pulse 302 (e.g., the half echo) can be used to construct the echo waveform associated with the full echo at time zero and thus derive the full echo at time zero.

In some examples, to construct the time zero echo ($E_0$) and obtain the time zero echo value 315 (also referred to herein as the apparent time-zero echo value), the NMR tool 205 can first measure the FID after the excitation pulse 302, which can then be used directly or further processed to mimic a full echo known herein as constructing the echo. In either case the signal is deconvoluted and summed to generate a time-zero echo value (e.g., the apparent time-zero echo value). In some examples, to deconvolute the FID signal, the FID signal can be multiplied by sine, the resonant frequency, and the cosine of the resonant frequency. For example, the time zero echo value 315 associated with $E_0$ can be generated as follows: S_x=echowaveform*cosine (2*π*resonant_frequency*acquisition_time+ acquisition_phase); and S_y=−echowaveform*sine (2*π*resonant_frequency*acquisition_time+ acquisition_phase), where echowaveform refers to the waveform of the FID signal after the excitation pulse 302 as either the raw FID or a constructed time zero echo type waveform.

In some cases, the time zero echo can be determined using the excitation pulse FID and a relationship between the excitation pulse FID and an echo FID. For example, an echo FID is similar to an excitation pulse FID in that the echo FID is a symmetric version of the excitation FID where the echo has a rise on the left and a decay on the right. Thus, the time zero echo can be constructed from the mirrored construction of the excitation FID. For example, the system 200 can use a transform, such as a Fourier transform, to identify frequencies within the FID signal. The system 200 can then construct one or more earlier (in time) portions of the FID signal based on the results of the transform used to determine the frequencies within the FID signal. The constructed time zero FID is reflected along time zero and referred to herein as the constructed echo waveform. Integration of the time zero constructed echo waveform can be used to obtain the time zero echo, $E_0$. In some cases, the construction of the time zero echo waveform is aided by using a spectral analysis of the frequencies in other echoes measured. In some cases, the construction of the echo may be aided by the use of the operational frequency. In some cases, the constructed echo envelope may be aided by the shapes of any of the echoes 1 to n. In some cases, the constructed echo envelope may be aided by a predetermined function such as the gaussian function or a sinc function.

In some examples, the time zero echo value 315 (e.g., the value of $E_0$) can be corrected to fit the theoretical time zero value of the decay curve 390, $A_0$ (e.g., calculated echo value 330). For example, the time zero echo value 315 can be compared with $A_0$ (e.g., calculated echo value 330) to determine a calibration correction factor for the time zero echo value 315. The correction factor can be applied to the time zero echo value 315 to correct the time zero echo value 315 and fit it to the $A_0$ value along the decay curve 390. The corrected value of $E_0$, referred to herein as $E_{c_0}$ can fall within time zero of the decay curve 390. In some examples, the correction factor can be calculated during a calibration experiment/process, and can be used in subsequent experiments, such as downhole experiments. Thus, a new correction factor does not need to be calculated every time an echo train is measured and a time zero echo value needs to be corrected as the correction factor calculated during calibration can be used to correct time zero echo values derived in subsequent experiments and echo train measurements. For example, once a correction factor for a time zero echo value is calculated during a calibration experiment, the correction factor can be applied during operation to a time zero echo value derived for a sample during a subsequent downhole experiment.

As noted above, the time zero echo value correction factor can be calculated during calibration, but can also be used to correct a time zero echo value determined for a sample in the field. In some cases, a respective correction factor can be calculated for each distorted echo value. For example, if the echoes at time one and time two are distorted, the calibration experiment can calculate a correction factor for the time one echo value and another correction factor for the time two echo value (e.g., in addition to calculating the correction factor for the time zero echo value as previously explained). The correction factor calculated for the time one echo value can be used to correct a time one echo value measured in a subsequent experiment (e.g., a downhole experiment) and the correction factor calculated for the time two echo value can be used to correct a time two echo value measured in the subsequent experiment).

Moreover, the value of $E_{c_0}$ (e.g., the corrected value of $E_0$) can be converted to porosity units to represent a porosity, $E_{cPU_0}$. For example, the time zero echo value (before or after being corrected using a correction factor as described herein) can be converted (e.g., from a first unit of the value, such as engineering units) to porosity units so that the converted time zero echo value represents a porosity, referred to as $E_{cPU_0}$ if corrected or $E_{PU_0}$ if not corrected. The projected value at time zero, $A_0$, is divided into the porosity of the calibration fluid to find the conversion factor. For water this value would be 100 PU. This value is then the conversion factor for converting all echoes to porosity.

To illustrate, during a calibration process, the $E_0$ value associated with a sample having a predetermined porosity, such as water having a 100% porosity and thus 100 porosity units (PUs), can be compared with the engineering units (arbitrary unit output of the tool) of the sample to determine a conversion factor that can be used to convert the value of $E_0$ into porosity units. For example, 100 PUs can be divided by the signal value in engineering units $E_0$, when it was derived from a sample with 100 PU, to determine the conversion factor. The value of $E_0$ in subsequent experiments can then be multiplied by the conversion factor to convert the newly measured value of $E_0$ into a value of porosity units. The conversion factor can be used this way for $E_0$. Alternatively, the projected value $A_0$ is used to make the porosity conversion factor. For example, the conversion factor can equal 100 PU/A0, when A0 is determined in a calibration tank with 100 PU and is in engineering units.

The echoes along the decay curve 390 can decay according to the $T_2$ relaxation time of the medium. In some aspects, magnetization can be allowed to recover fully or partially for the next pulse or sequence, and the medium can be probed again by another pulse or sequence.

An inversion on a corrected time zero echo (e.g., $E_{c_0}$) as well as one or more other echoes in an echo train (e.g., the corrected time one echo ($E_{c_1}$), the corrected time two echo ($E_{c_2}$), and/or any other of the echo values 336 through 388) can be used to determine a spectrum of a sample(s). The spectrum can be used to evaluate characteristics/properties of the sample, such as petrophysical quantities of the sample. In some examples, after the echo at time zero is corrected and converted to porosity units, the corrected and converted time zero echo, $E_{cpu_0}$, can be used along with other corrected and converted echoes to determine a porosity of a sample. In some cases, the correction and conversion factor(s) determined for a time zero echo during calibration can be used to correct and convert a time zero echo determined on the field based on an FID waveform associated with a sample, as described herein. The corrected and converted time zero echo can then be used to determine petrophysical properties of the sample.

In some inversions, $E_{cpu_0}$ can be placed in time at the end of a 90 pulse duration according to the sequence timing. For example, the center of the excitation pulse is often set to 0 so such placement of $E_{cpu_0}$ would put the time of $E_{cpu_0}$ at half of the excitation duration. To illustrate, if the 90 pulse duration is 40 microseconds, then $E_{cpu_0}$ would be at 20 microseconds.

In an example inversion of NMR data, the NMR tool 205 can first acquire echoes based on the pulse sequence used. In this example, such data is designated as S(t). To interpret the data, S(t) can be inverted into a different basis such as $T_2$ (e.g., transverse relaxation), $T_1$ (e.g., longitudinal recover time), or D (e.g., diffusion). The inversion produces spectrum components (e.g., coefficients) which can be correlated to a time (e.g., $T_1$ or $T_2$) or diffusion axis. The spectrum can be used to make petrophysical conclusions about a sample, such as a formation. To perform the inversion, the data can be fit to known answers as follows:

$$s(t) = \sum_{ij} x_{ij} \cdot A(T_{1i}, T_{2j}) \qquad \text{Equation (1)}$$

When the NMR tool 205 is stationary, the signal, omitting surface/volume interaction, can include a series of echoes for each wait time, where the jth echo for the kth wait time has the form:

$$y^{k,m}(n) = \qquad \text{Equation (2)}$$

$$\sum_{h=1}^{r} \sum_{j=1}^{q} \sum_{i=1}^{p} x_{ij} \cdot \left(1 - e^{-\frac{TW_k}{T_{1i}}}\right) \cdot e^{-\frac{\tau_n}{T_{2j}}} \cdot e^{-\frac{D_h(\gamma \cdot G_b \cdot TE_m)^2 \cdot \tau_n}{12}}$$

where $y^{k,m}(n)$ is the nth echo for the kth wait time for the mth TE, q is the total number of $T_2$ components, p is the total number of $T_1$ components, r is the number of diffusion constants, n is the count of the echo, m is the number of TEs, $x_{11}$ through $x_{pq}$ are the amplitudes of the respective spectrum components, $TW_k$ is the kth wait time, $T_{2i}$ through $T_{2q}$ are the $T_2$ time constants for each of the q factors, $T_{1i}$ through $T_{1p}$ are the $T_1$ time constants for each of the p factors, $TE_m$ is the inter-echo time, $\tau_n$ is the time when the nth echo is acquired, $D_h$ is the hth diffusion constant, $\gamma$ is the gyromagnetic ratio, and Gb is the average gradient for a single band b.

While Equation (2) includes little assumptions, in practice Equation (2) can be simplified. The exact simplification used can vary. In some examples, simplifications for $T_1$ may use a ratio between $T_1$ and $T_2$, may use only a single TE, may assume a single Gradient (G), and/or may assume a constant diffusion (D). In some aspects the simplification can have the form as follows in Equation (3).

$$y^k(n) = \sum_{i=1}^{p} x_i \cdot \left(1 - e^{-\frac{TW_k}{T_{1i}}}\right) \cdot e^{-\frac{n \cdot TE}{T_{2i}}} \cdot e^{-\frac{D(\gamma \cdot G \cdot TE)^2 \cdot n \cdot TE}{12}} \qquad \text{Equation (3)}$$

where $y^k(j)$ is the jth echo for the kth wait time, p is the total number of $T_1$ components, $x_1$ through $x_p$ are the amplitudes of the respective spectrum components, $TW_k$ is the kth wait time, $T_{1i}$ through $T_{1p}$ are the $T_1$ time constants for each of the p factors, $T_{2i}$ through $T_{2p}$ are the $T_2$ time constants for each of the p factors (note that to eliminate the j dimension of the x matrix in Equation (1) and thereby simplify Equation (2), $T_{2j}$ is assumed to be proportional to $T_{1i}$ so that $T_{2j} \propto T_{1i}$ for all i and j for a particular wait time $TW_k$ and $T_{2j}$ is renamed $T_{2i}$), TE is the inter-echo time (note that, in some cases, to simplify Equation (2), only one inter-echo time is assumed), D is the diffusion constant, $\gamma$ is the gyromagnetic ratio, and G is the gradient.
Equation (3) can be written in matrix form as follows:

$$TW_1 \begin{bmatrix} y^1(1) \\ y^1(2) \\ \dots \\ y^1(n_1) \\ TW_2 \\ y^2(1) \\ y^2(2) \\ \dots \\ y^2(n_2) \\ \dots \\ y^m(1) \\ y^m(2) \\ \dots \\ TW_m \\ y^m(n_m) \end{bmatrix} = \begin{bmatrix} A^1_{11} & A^1_{21} & \cdots & A^1_{p1} \\ A^1_{12} & A^1_{22} & \cdots & A^1_{p2} \\ \dots & \dots & \dots & \dots \\ A^1_{1n_1} & A^1_{2n_1} & \cdots & A^1_{pn_1} \\ A^2_{11} & A^2_{21} & \cdots & A^1_{p1} \\ A^2_{12} & A^2_{22} & \cdots & A^2_{p2} \\ \dots & \dots & \dots & \dots \\ A^2_{1n_2} & A^2_{2n_2} & \cdots & A^2_{pn_2} \\ \dots & \dots & \dots & \dots \\ A^m_{11} & A^m_{21} & \cdots & A^m_{p1} \\ A^m_{12} & A^m_{22} & \cdots & A^m_{p2} \\ \dots & \dots & \dots & \dots \\ A^m_{1n_m} & A^m_{2n_m} & \cdots & A^m_{pn_m} \end{bmatrix} \begin{bmatrix} x_1 \\ x_2 \\ \dots \\ x_p \end{bmatrix} \qquad \text{Equation (4)}$$

where, ignoring the term with the diffusion constant because D is not known, the vector $$A^k_{ij}$$

representing the combined echo trains with all recovery times can be as follows:

$$A^k_{ij} = A^{WT\,number}_{T2\,bin, echo\,number} = \left(1 - e^{-\frac{TW_k}{T_{1i}}}\right) \cdot e^{\frac{j \cdot TE}{T_{2i}}} \qquad \text{Equation (5)}$$

In some examples, Equation (4) above can be shortened as:

$$Y = AX \qquad \text{Equation (6)}$$

where:

$$Y = \begin{bmatrix} y^1(1) \\ y^1(2) \\ \dots \\ y^1(n_1) \\ y^2(1) \\ y^2(2) \\ \dots \\ y^2(n_2) \\ \dots \\ y^m(1) \\ y^m(2) \\ \dots \\ y^m(n_m) \end{bmatrix},$$

$$A = \begin{bmatrix} \vec{A^k_1} & \vec{A^k_2} & \dots & \vec{A^k_p} \end{bmatrix},$$

$$X = \begin{bmatrix} x_1 \\ x_2 \\ x_3 \\ \dots \\ x_p \end{bmatrix}, \text{ and}$$

$$\text{Vector } A^k_i = \begin{bmatrix} A^1_{i1} \\ A^1_{i2} \\ \dots \\ A^1_{in_1} \\ A^2_{i1} \\ A^2_{i2} \\ \dots \\ A^2_{in_2} \\ \dots \\ A^m_{i1} \\ A^m_{i2} \\ \dots \\ A^1_{in_m} \end{bmatrix} \text{ is the column vector}$$

In some examples, vector $$A^k_i$$

can be re-written as follows:

$$\text{Vector } A^k_i = \begin{bmatrix} \text{Vector } B^1_i \\ \text{Vector } B^2_i \\ \dots \\ \text{Vector } B^m_i \end{bmatrix} \qquad \text{Equation (7)}$$

where:

$$Vector\ B_i^k = \begin{bmatrix} A_{i1} \\ A_{i2}^k \\ \ldots \\ A_{in_m}^k \end{bmatrix}.$$

Equation (8)

Vector $$B_i^k$$

is an echo train with recovery time $TW_k$, a $T_1$ time constant equals $T_{1i}$, a $T_2$ time constant equals $T_{2i}$, and $n_k$ echoes. The vector $$A_i^k$$

is the combined echo trains with all recovery times $TW_1$ through $TW_m$, but the same $T_1$ time constant and $T_2$ time constant for each recovery time.

Vector $$A_i^k$$

is called a single $T_1$ component echo vector. The spectrum vector X is given by:

$$X = A^{-1} Y$$

Equation (9)

For $T_2$ inversion, the equations can be simplified further. For example, the $T_1$ dependency can be removed leaving the following:

$$y^k(n) = \sum_{i=1}^{p} x_i \cdot e^{-\frac{n \cdot TE}{T_{2i}}} \cdot e^{-\frac{D(\gamma \cdot G \cdot TE)^2 \cdot n \cdot TE}{12}}$$

Equation (10)

Where $y^k(j)$ is the jth echo for the kth wait time, p is the total number of $T_2$ components, $x_1$ through $x_p$ are the amplitudes of the respective spectrum components, $T_{2i}$ through $T_{2p}$ are the $T_2$ time constants for each of the p factors, TE is the inter-echo time (note that, to simplify Equation (2), only one inter-echo time may be assumed), D is the diffusion constant, $\gamma$ is the gyromagnetic ratio, and G is the gradient.

Equation (10) can be written in matrix form as follows:

$$\begin{bmatrix} y(1) \\ y(2) \\ \ldots \\ y(n) \end{bmatrix} = \begin{bmatrix} A_{11} & A_{12} & \ldots & A_{1n} \\ A_{21} & A_{22} & \ldots & A_{2n} \\ \ldots & \ldots & \ldots & \ldots \\ A_{31} & A_{32} & \ldots & A_{3n} \end{bmatrix} \begin{bmatrix} x_1 \\ x_2 \\ \ldots \\ x_p \end{bmatrix}$$

Equation (5) can be used to invert the data into the $T_1$ or $T_2$ time domain with the coefficients being used as a spectrum in those domains. The matrix A can be referred to as a kernel and can be created using the selected basis function for the inversion. Some inversions will use the governing equation, Equation (2), or a simplification of it such as Equation (3) or Equation (10). Some other inversions may use an even simpler basis function such as a line.

In some examples, projected echoes can be made by fitting or inverting the data and using the results of that fitting or inversion to calculate the theoretical value of an echo at a certain time. In some cases, data projection can start from a basis function used during first inversions, such as Equation (2) or Equation (3), for example. The echoes projected are those that need correction. Those echoes usually include $E_1$ and $E_2$ but could include other echoes depending on the magnet and antenna of the tool. $E_0$ will also need to be corrected.

In some aspects, a projected echo can be represented by $$A_{i,j}^k,$$

where k, i, and j are indexes for WT, $T_1$, and $T_2$. If the echo is for a T2 only sequence it could be represented by $A_i$.

$$A_{i,j}^k = \sum_{i,j} x_{i,j} \cdot basisfuction$$

The projected point found during a calibration is divided by the measured echo value to make the correction factor. The correction factor is then used on subsequent experiments to correct the echo into alignment with the other echoes.

Figure 4A:
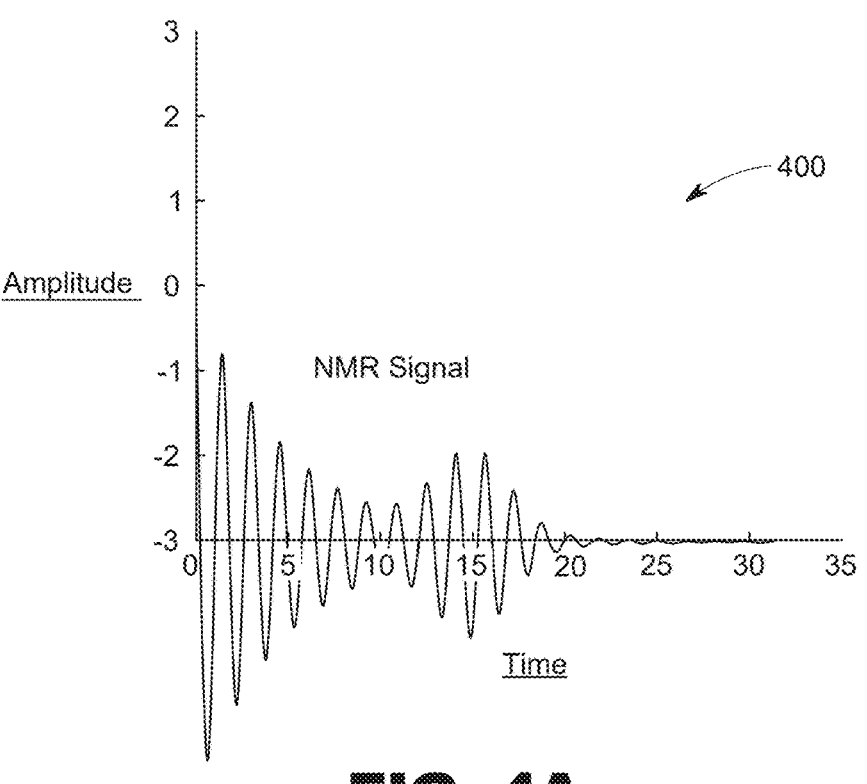
FIG. 4A is a diagram illustrating an example nuclear magnetic resonance signal and ringing, according to some examples of the present disclosure.

FIG. 4A is a diagram illustrating an example signal 400 from an NMR tool. The received signal 400 shown in FIG. 4A represents a full signal after an excitation pulse (and/or a pulse sequence). As previously explained, the excitation antenna (e.g., excitation antenna 212) of the NMR tool (e.g., NMR tool 205) used to generate the excitation pulse can experience ringdown even after the excitation pulse was generated, which can prevent or limit the ability of the excitation antenna to measure a signal while there is ringdown decreasing the SNR of the signal and/or otherwise obfuscating or distorting the signal.

Figure 4B:
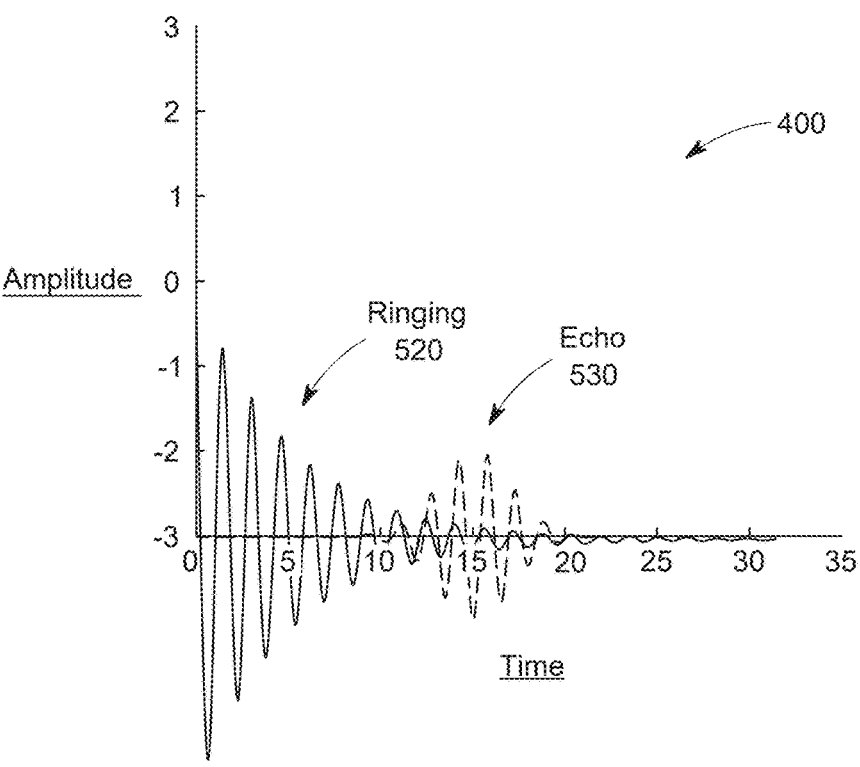
FIG. 4B is a diagram illustrating an example nuclear magnetic resonance signal and ringing components, according to some examples of the present disclosure.

FIG. 4B illustrates the example NMR signal 400 with a ringing component and an echo component. As shown, the received signal 400 includes a ringing portion and an echo portion. For example, a portion 420 of the waveform of the received signal 400 corresponds to ringing encountered for a period of time after the excitation pulse, and another portion 430 of the received signal 400 at a time after the ringing includes an echo waveform 430. Here, the ringing represented by the portion 420 of the received signal occurs for a brief period of time after the excitation pulse, including time zero. During this time, the ringing can prevent the NMR tool from observing/measuring the NMR signal for a period of time while the ringing occurs. After the ringing ends or subsides at least a threshold amount, the NMR tool can measure the portion 430 of the waveform corresponding to the echo.

As further described herein, in some aspects, to avoid the noise from the ringing, the NMR tool can use an excitation antenna to produce the excitation pulse, and a different antenna to measure the NMR signal early in time after the excitation pulse, including while the excitation antenna experiences the ringing. The measured signal can be used to derive an effective echo at time zero, which can be used to gain additional insights about a sample/volume, such as porosity information.

FIG. 5 is a flowchart illustrating an example calibration process 500 for determining correction and conversion factors for correcting echo values associated with an NMR sequence and converting the echo values to certain units (e.g., porosity units, etc.), according to some examples of the present disclosure. In some examples, the calibration process 500 can be performed in a laboratory during a calibration experiment, and the correction and conversion factors can be used to correct and convert echo values obtained in a subsequent experiment, such as an operating or logging experiment in a downhole environment.

At block 502, the process 500 can include obtaining a sequence of waveforms. In some cases, the sequence of waveforms can be obtained using an NMR tool (e.g., NMR tool 205) in a laboratory. For example, the NMR tool can obtain the sequence of waveforms in a laboratory during a calibration experiment. In some examples, the sequence of waveforms can include a set of echo waveforms associated with refocusing pulses generated by the NMR tool and a free induction decay (FID) waveform associated with an excitation pulse generated by the NMR tool.

At block 504, the process 500 can include determining a set of echo values based on the set of echo waveforms. At block 506, the process 500 can include determining an apparent time-zero echo value(s) based on the FID waveform. The apparent time-zero echo value(s) can represent an echo at time zero of a time domain (e.g., $E_0$). Moreover, the set of echo values can represent echoes along a set of times (e.g., $E_1$ through $E_n$) after time zero of the time domain. In some examples, the apparent time-zero echo value(s) can be determined by deconvoluting the FID waveform and summing components of the FID waveform extracted via the deconvoluting of the FID waveform.

At block 508, the process 500 can include determining a correction factor for the echo at time zero (e.g., $E_0$) associated with the apparent time-zero echo value(s). The correction factor can be used to correct a distortion of the apparent time-zero echo value(s) so the apparent time-zero echo value(s) is consistent with a projected time zero echo value (e.g., $A_0$) along a theoretical decay curve (e.g., decay curve 390), as further described herein. For example, the apparent time-zero echo value(s) can be multiplied by the correction factor to correct a distortion of the apparent time-zero echo value(s) so the apparent time-zero echo value(s) is consistent with (e.g., equals) the projected time zero echo value ($A_0$) along the theoretical decay curve. In some cases, the correction factor can be applied to a time zero echo value processed in a subsequent experiment (e.g., during operation in a downhole environment) as further described below with respect to the process 600 shown in FIG. 6.

In some examples, the correction factor can be calculated by comparing the apparent time-zero echo value(s) (e.g., the value of $E_0$) with the projected time zero echo value (e.g., $A_0$) along the theoretical decay curve (e.g., decay curve 390). For example, the correction factor can be calculated by dividing the projected time zero echo value (e.g., $A_0$) by the apparent time-zero echo value(s) (e.g., the value of $E_0$) to determine a factor that, when applied (e.g., multiplied) to the apparent time-zero echo value(s), results in a corrected echo value(s) that is equal to the projected time zero echo value ($A_0$). As previously noted, the correction factor can then be used to correct a time zero echo value determined in a subsequent experiment, such as during an operation experiment (e.g., a logging operation or logging mode operation) in a downhole environment, as further described below with respect to FIG. 6.

In some examples, the decay curve can be generated based on a portion of the set of echo values that excludes any distorted echo values. For example, the decay curve can be generated based on a portion of the set of echo values that excludes the apparent time-zero echo value(s), a first echo value representing a first echo at time one of the time domain (e.g., $E_1$), and a second echo value representing a second echo at time two of the time domain (e.g., $E_2$). In some cases, the one or more distorted echo values excluded from the portion of echo values used to generate the decay curve can include other echo values along the time domain.

In some cases, in addition to determining a correction factor for the echo at time zero (e.g., $E_0$), the process 500 can include determining a respective correction factor for any other distorted echo value (e.g., for each of the one or more distorted echo values). The respective correction factor for a distorted echo value can similarly be calculated by comparing that distorted echo value with a corresponding echo value projected along the decay curve. For example, to determine the respective correction factor for a distorted echo value at time one along the time domain, the distorted echo value can be compared to an echo value projected at time one on the decay curve. The respective correction factor can represent a factor that can correct that distorted echo value to yield a corrected echo value(s) equal to the echo value projected at time one on the decay curve. In this way, correction factors can be determined for any distorted echo values at one or more times along a time domain, and used to correct the distorted echo values and/or used in any subsequent experiments to correct any distorted echo values obtained for the one or more times along the time domain during the subsequent experiments.

At block 510, the process 500 can include determining one or more conversion factors for a plurality of echoes that includes the apparent time-zero echo value(s) (e.g., the echo at time zero, $E_0$) and the set of echo values (e.g., the echoes along the set of times after time zero). In some cases, the plurality of echoes can include the apparent time-zero echo value(s) after the apparent time-zero echo value(s) is corrected using the correction factor (e.g., the corrected echo value(s), $E_{c_0}$). In other cases, the plurality of echoes can include the apparent time-zero echo value(s) before the apparent time-zero echo value(s) is corrected using the correction factor (e.g., $E_0$). The one or more conversion factors can be used to convert the plurality of echo values from a first unit to a second unit, such as from engineering units to porosity units.

In some aspects, the one or more conversion factors can be determined by comparing the apparent time-zero echo value(s), the apparent time-zero echo value(s) after correction using the correction factor (e.g., $E_{c_0}$), or the projected time zero echo value (e.g., A0) with a predetermined porosity of a sample associated with the corrected echo value(s). For example, in some cases, the process 500 can include comparing the corrected echo value(s) ($E_{c_0}$) with the predetermined porosity value of the sample, and determining a conversion factor for converting the plurality of echo values (e.g., including the apparent time-zero echo value(s) or the corrected echo value(s)) to porosity units based on the comparing of the corrected echo value(s) with the predetermined porosity value of the sample.

The conversion factor can be applied to the plurality of echo values (e.g., including the apparent time-zero echo value(s) or the corrected echo value(s)) to yield converted echo values in porosity units (e.g., $E_{cPU_0}$ through $E_{cPU_n}$). In some examples, the conversion factor can be applied to any echo values in an echo train obtained in an experiment, such as a subsequent experiment(s) (e.g., a production/operation experiment in a downhole environment) in order to convert such echo values to porosity units.

FIG. 6 is a flowchart illustrating an example process 600 for determining echo values associated with a sample/volume and using the echo values to determine a spectrum associated with the sample/volume, according to some examples of the present disclosure.

At block 602, the process 600 can include obtaining a sequence of waveforms via a nuclear magnetic resonance (NMR) tool (e.g., NMR tool 205) in a borehole. The sequence of waveforms can include a set of echo waveforms associated with refocusing pulses generated by the NMR tool and a free induction decay (FID) waveform associated with an excitation pulse generated by the NMR tool.

At block 604, the process 600 can include determining a set of echo values based on the set of echo waveforms. For example, in some cases, the process 600 can generate an echo value for each echo waveform by deconvoluting the echo waveform and summing components of the echo waveform.

At block 606, the process 600 can include determining an apparent time-zero echo value based on the FID waveform. The apparent time-zero echo value can represent an echo at time zero of a time domain (e.g., $E_0$) and the set of echo values can represent echoes along a set of times (e.g., $E_1$ through $E_n$) after time zero of the time domain.

In some examples, determining the apparent time-zero echo value can include deconvoluting the FID waveform and summing components of the FID waveform extracted via the deconvoluting of the FID waveform.

In some aspects, the FID waveform can be or represent a half echo $E_{h_0}$ generated after the excitation pulse, and determining the apparent time-zero echo value can include determining a full echo corresponding to time zero of the time domain based on the half echo $E_{h_0}$. In some cases, determining the apparent time-zero echo value can include determining the full echo based on one or more frequencies within the FID waveform and/or a symmetric relationship between the FID waveform associated with the excitation pulse and an echo FID associated with the full echo. For example, the system 200 can use a transform to identify frequencies within the FID. The system 200 can then construct one or more earlier (in time) portions of the FID, such as a first/left half of the waveform of the FID, based on the frequencies within the FID and the relationship between the excitation pulse FID and the echo FID.

At block 608, the process 600 can include applying a correction factor to the apparent time-zero echo value to yield a corrected time zero echo value (e.g., $E_{c_0}$). The correction factor can include a factor calculated to correct a distortion of the apparent time-zero echo value, as previously explained. In some aspects, the correction factor can be determined during a calibration process (e.g., calibration process 500). In some aspects, the correction factor can be determined based on a projected time zero echo value along a decay curve (e.g., decay curve 390) and an associated time-zero echo value calculated during a calibration (e.g., which in some cases can include a time-zero echo value previously derived during a previous calibration process (e.g., the calibration process 500) and in other cases where the apparent time-zero echo value from block 606 is derived as part of a calibration process can include the apparent time-zero echo value from block 606 derived as part of the calibration process).

For example, in some cases, an apparent time-zero echo value derived during a calibration experiment can be compared with a projected time zero echo value along a decay curve (e.g., decay curve 390) to determine the correction factor based on the comparison. Thus, the process 600 can then include determining, based on the comparing of the apparent time-zero echo value with the projected time zero echo value along the decay curve, the correction factor. As noted above, the decay curve can be generated based on a portion of echo values of an echo train excluding any distorted echo values in the echo train, such as the apparent time-zero echo value, a first echo value representing a first echo at time one of the time domain (e.g., $E_1$) and a second echo value representing a second echo at time two of the time domain (e.g., $E_2$) (as well as any other distorted echo values, if any).

At block 610, the process 600 can include determining a spectrum associated with a sample based on an inversion performed on the corrected echo value and the set of echo values before or after a conversion of the corrected time zero echo value and the set of echo values to porosity units. The conversion of the corrected time zero echo value and the set of echo values can be based on one or more conversion factors. In some cases, the process 600 can include determining the spectrum associated with the sample based on an inversion performed on the corrected echo value and the set of echo values before a conversion of the corrected time zero echo value and the set of echo values to porosity units. In other cases, the process 600 can include determining the spectrum associated with the sample based on an inversion performed on the corrected echo value and the set of echo values after a conversion of the corrected time zero echo value and the set of echo values to porosity units. To illustrate, the process 600 can include converting, based on one or more conversion factors, the apparent time-zero echo value and the set of echo values to porosity units to yield converted echo values in porosity units (e.g., $E_{cPU_0}$ through $E_{cPU_n}$), and determining the spectrum associated with the sample based on an inversion performed on the converted echo values.

In some cases, the one or more conversion factors can include at least one conversion factor calculated during a calibration process (e.g., calibration process 500) for converting echo values from certain units, such as engineering units, to porosity units. For example, in some aspects, the one or more conversion factors can be determined during a calibration experiment or process, such as calibration process 500 described above with respect to FIG. 5, by comparing a corrected echo value corresponding to time zero, such as a corrected echo value for time zero derived during the calibration experiment or process, with a predetermined porosity of a sample associated with the corrected echo value.

In some aspects, the process 600 can include determining petrophysical quantities associated with the sample based on the spectrum.

In some aspects, the process 600 can include generating, via the NMR tool (e.g., NMR tool 205), an NMR pulse sequence, such as a Carr-Purcell-Meiboom-Gill (CPMG) sequence, an inversion recovery sequence, or a spin-echo pulse sequence, and measuring the sequence of waveforms via the NMR tool. In some examples, one or more excitation pulses associated with the NMR pulse sequence can be generated via a first antenna of the NMR tool and the FID waveform can be measured via a second antenna of the NMR tool in order to measure the FID waveform without distortion caused by ringing since the antenna used to measure the FID waveform is different from the antenna used to generate the one or more excitation pulses.

In some aspects, determining a spectrum associated with a sample based on an inversion can include transforming, using a transform (e.g., a Laplace transform or any other transform), the corrected echo value and the set of echo values (e.g., their respective values before or after the conversion of the corrected echo value and the set of echo values to porosity units) from a first domain to a second domain. In some examples, the first domain can include the time domain and the second domain can include a longitudinal relaxation $(T_1)$ domain, a transverse relaxation $(T_2)$ domain, a $T_1$-$T_2$ domain, a $T_1$-Diffusion (D) domain, a $T_2$-D domain, or a $T_1$-$T_2$-D domain. In some aspects, the process 800 can also include generating spectrum coefficients for values in the second domain based on the transforming of the corrected echo value and the set of echo values (e.g., their respective values before or after the conversion of the corrected echo value and the set of echo values to porosity units) from the first domain to the second domain.

Figure 7:
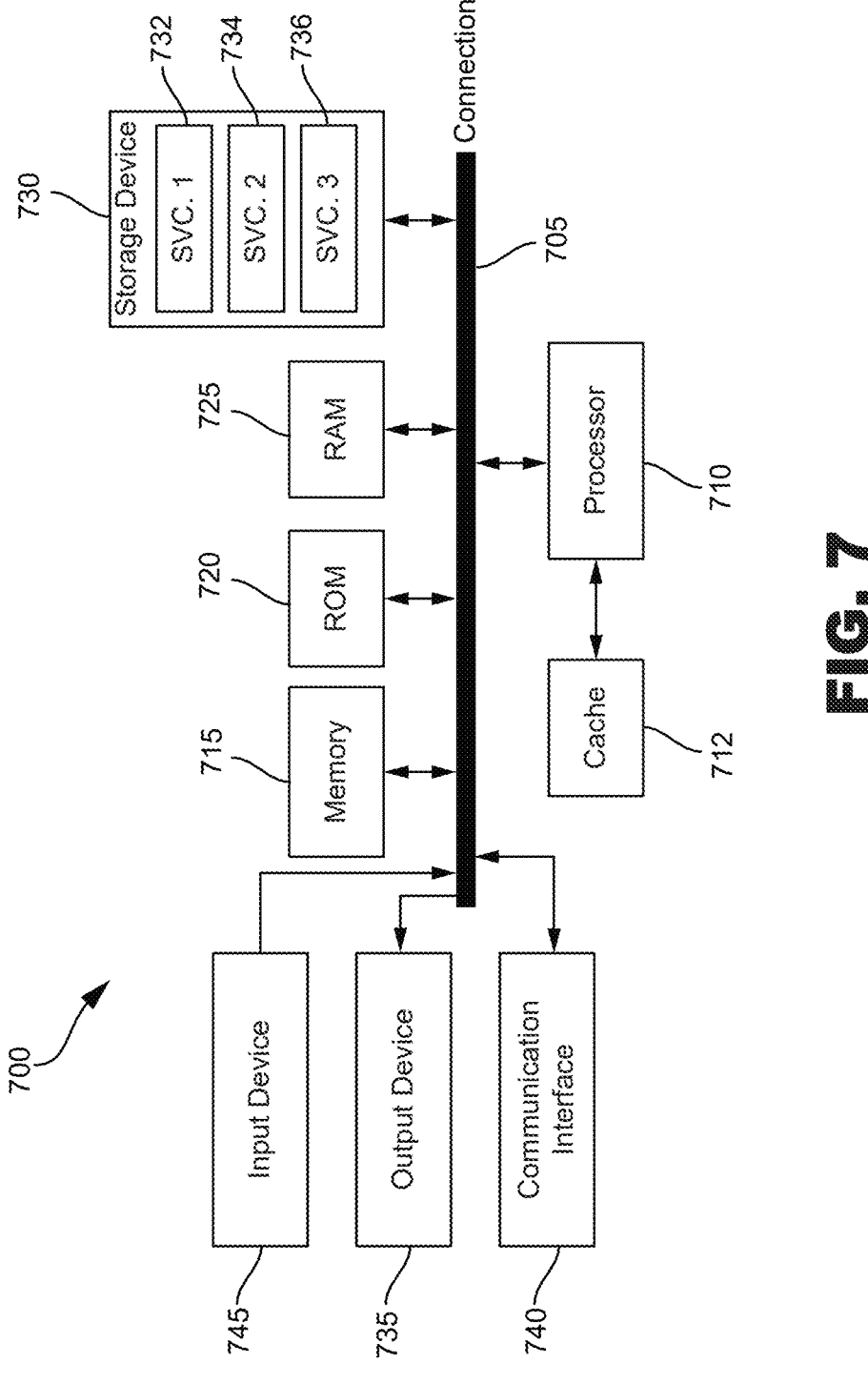
FIG. 7 illustrates an example computing device and hardware that can be used to implement some aspects of the disclosed technology.

FIG. 7 illustrates an example computing device architecture 700 which can be employed to perform any of the systems and techniques described herein. In some examples, the computing device architecture can be integrated with one or more devices described herein, such as system 200, NMR tool 205, etc. Further, the computing device can be configured to implement at least some of the systems and techniques described herein.

The components of the computing device architecture 700 are shown in electrical communication with each other using a connection 705, such as a bus. The example computing device architecture 700 includes a processing unit (CPU or processor) 710 and a computing device connection 705 that couples various computing device components including the computing device memory 715, such as read only memory (ROM) 720 and random-access memory (RAM) 725, to the processor 710.

The computing device architecture 700 can include a cache of high-speed memory connected directly with, in close proximity to, or integrated as part of the processor 710. The computing device architecture 700 can copy data from the memory 715 and/or the storage device 730 to the cache 712 for quick access by the processor 710. In this way, the cache can provide a performance boost that avoids processor 710 delays while waiting for data. These and other modules can control or be configured to control the processor 710 to perform various actions. Other computing device memory 715 may be available for use as well. The memory 715 can include multiple different types of memory with different performance characteristics. The processor 710 can include any general-purpose processor and a hardware or software service, such as service 1 732, service 2 734, and service 3 736 stored in storage device 730, configured to control the processor 710 as well as a special-purpose processor where software instructions are incorporated into the processor design. The processor 710 may be a self-contained system, containing multiple cores or processors, a bus, memory controller, cache, etc. A multi-core processor may be symmetric or asymmetric.

To enable user interaction with the computing device architecture 700, an input device 745 can represent any number of input mechanisms, such as a microphone for speech, a touch-sensitive screen for gesture or graphical input, keyboard, mouse, motion input, speech and so forth.

An output device 735 can also be one or more of a number of output mechanisms known to those of skill in the art, such as a display, projector, television, speaker device, etc. In some instances, multimodal computing devices can enable a user to provide multiple types of input to communicate with the computing device architecture 700. The communications interface 740 can generally govern and manage the user input and computing device output. There is no restriction on operating on any particular hardware arrangement and therefore the basic features here may easily be substituted for improved hardware or firmware arrangements as they are developed.

Storage device 730 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 725, read only memory (ROM) 720, and hybrids thereof. The storage device 730 can include services 732, 734, 736 for controlling the processor 710. Other hardware or software modules are contemplated. The storage device 730 can be connected to the computing device connection 705. In one aspect, a hardware module that performs a particular function can include the software component stored in a computer-readable medium in connection with the necessary hardware components, such as the processor 710, connection 705, output device 735, and so forth, to carry out the function.

For clarity of explanation, in some instances the present technology may be presented as including individual functional blocks including functional blocks comprising devices, device components, steps or routines in a method implemented in software, or combinations of hardware and software.

In some instances, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific examples and aspects thereof, but those skilled in the art will recognize that the application is not limited thereto. Thus, while illustrative examples and aspects of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, examples and aspects of the systems and techniques described herein can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate examples, the methods may be performed in a different order than that described.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the method, algorithms, and/or operations described above. The computer-readable data storage medium may form part of a computer program product, which may include packaging materials.

The computer-readable medium may include memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

Methods and apparatus of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Such methods may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or another word that substantially modifies, such that the component need not be exact. For example, substantially cylindrical means that the object resembles a cylinder, but can have one or more deviations from a true cylinder.

The term "radially" means substantially in a direction along a radius of the object, or having a directional component in a direction along a radius of the object, even if the object is not exactly circular or cylindrical. The term "axially" means substantially along a direction of the axis of the object. If not specified, the term axially is such that it refers to the longer axis of the object.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Illustrative aspects of the disclosure include:

Aspect 1. A method comprising: obtaining a sequence of waveforms via a nuclear magnetic resonance (NMR) tool in a borehole, the sequence of waveforms comprising a set of echo waveforms associated with refocusing pulses generated by the NMR tool and a free induction decay (FID) waveform associated with an excitation pulse generated by the NMR tool; determining a set of echo values based on the set of echo waveforms; determining an apparent time-zero echo value based on the FID waveform, the apparent time-zero echo value representing an echo at time zero of a time domain and the set of echo values representing echoes along a set of times after time zero of the time domain; applying a correction factor to the apparent time-zero echo value to yield a corrected time zero echo value; and determining a spectrum associated with a sample based on an inversion performed on the corrected time zero echo values and the set of echo values before or after a conversion of the corrected time zero echo value and the set of echo values to porosity units, the conversion of the corrected time zero echo value and the set of echo values being based on one or more conversion factors.

Aspect 2. The method of Aspect 1, wherein determining the apparent time-zero echo value comprises deconvoluting the FID waveform and summing components of the FID waveform extracted via the deconvoluting of the FID waveform.

Aspect 3. The method of any of Aspects 1 to 2, wherein the FID waveform represents a half echo generated after the excitation pulse, and wherein determining the apparent time-zero echo value comprises constructing a full echo corresponding to time zero of the time domain based on the half echo.

Aspect 4. The method of Aspect 3, wherein determining the apparent time-zero echo value comprises: determining the full echo based on at least one of a symmetric relationship between the FID waveform associated with the excitation pulse and an echo FID associated with the full echo, and one or more frequencies within the FID waveform.

Aspect 5. The method of any of Aspects 1 to 4, further comprising: comparing the apparent time-zero echo value with a projected time zero echo value along a decay curve, wherein the decay curve is generated based on a portion of the set of echo values, the portion of the set of echo values excluding a time one echo value representing a first echo at time one of the time domain and a time two echo value representing a second echo at time two of the time domain;

and based on the comparing of the apparent time-zero echo value with the projected time zero echo value along the decay curve, determining the correction factor applied to the apparent time-zero echo value.

Aspect 6. The method of Aspect 5, further comprising: comparing the corrected echo value or the projected time zero echo value with a predetermined porosity value of a sample; and determining the one or more conversion factors based on the comparing of the corrected echo value or the projected time zero echo value with the predetermined porosity value of the sample.

Aspect 7. The method of any of Aspects 1 to 6, further comprising: determining petrophysical quantities associated with the sample based on the spectrum.

Aspect 8. The method of any of Aspects 1 to 7, further comprising: generating, via the NMR tool, an NMR pulse sequence comprising a Carr-Purcell-Meiboom-Gill (CPMG) sequence, an inversion recovery sequence, or a spin-echo pulse sequence, wherein one or more excitation pulses associated with the NMR pulse sequence are generated via a first antenna of the NMR tool; and measuring the sequence of waveforms via the NMR tool, wherein echo waveforms from the sequence of waveforms are measured via at least one of the first antenna and a second antenna of the NMR tool.

Aspect 9. The method of any of Aspects 1 to 8, wherein determining a spectrum associated with a sample based on the inversion comprises: transforming, using a transform, the corrected echo value and the set of echo values before or after the conversion from a first domain to a second domain, wherein the first domain comprises the time domain and wherein the second domain comprises a longitudinal relaxation (T1) domain, a transverse relaxation (T2) domain, a T1-T2 domain, a T1-Diffusion (D) domain, a T2-D domain, or a T1-T2-D domain; and generating spectrum coefficients for values in the second domain based on the transforming of the corrected echo value and the set of echo values before or after the conversion from the first domain to the second domain.

Aspect 10. A system comprising: a nuclear magnetic resonance (NMR) tool comprising a magnet and two or more antennas, the NMR tool configured to measure a sequence of NMR waveforms associated with a sample in a borehole, the sequence of NMR waveforms comprising a free induction decay (FID) waveform measured by a first antenna of the two or more antennas after an excitation pulse generated by a second antenna of the two or more antennas and a set of echo waveforms associated with refocusing pulses generated by at least one of the two or more antennas; and one or more processors coupled to a memory, the one or more processors configured to: determine a set of echo values based on the set of echo waveforms; determine an apparent time-zero echo value based on the FID waveform, the apparent time-zero echo value representing an echo at time zero of a time domain and the set of echo values representing echoes along a set of times after time zero of the time domain; apply a correction factor to the apparent time-zero echo value to yield a corrected time zero echo value; and determine a spectrum associated with a sample based on an inversion performed on the corrected echo value and the set of echo values before or after a conversion of the corrected time zero echo value and the set of echo values to porosity units, the conversion of the corrected time zero echo value and the set of echo values being based on one or more conversion factors.

Aspect 11. The system of Aspect 10, wherein determining the apparent time-zero echo value comprises deconvoluting the FID waveform and adding components of the FID waveform extracted via the deconvoluting of the FID waveform.

Aspect 12. The system of any of Aspects 10 to 11, wherein the FID waveform represents a half echo generated after the excitation pulse, and wherein determining the apparent time-zero echo value comprises determining a full echo corresponding to time zero of the time domain based on the half echo.

Aspect 13. The system of Aspect 12, wherein determining the apparent time-zero echo value comprises: determining the full echo based on at least one of a symmetric relationship between the FID waveform associated with the excitation pulse and an echo FID associated with the full echo, and one or more frequencies within the FID waveform.

Aspect 14. The system of any of Aspects 10 to 13, wherein the one or more processors are configured to: compare the apparent time-zero echo value with a projected time zero echo value along a decay curve, wherein the decay curve is generated based on a portion of the set of echo values, the portion of the set of echo values excluding a time one echo value representing a first echo at time one of the time domain and a time two echo value representing a second echo at time two of the time domain; and based on the comparing of the apparent time-zero echo value with the projected time zero echo value along the decay curve, determine the correction factor.

Aspect 15. The system of any of Aspects 1 to 14, wherein the one or more processors are configured to: compare the corrected echo value with a predetermined porosity value of a sample; and determine the one or more conversion factors based on the comparing of the corrected echo value with the predetermined porosity value of the sample.

Aspect 16. The system of any of Aspects 10 to 15, wherein the one or more processors are configured to determine petrophysical quantities associated with the sample based on the spectrum.

Aspect 17. The system of any of Aspects 10 to 16, wherein the NMR tool is configured to: generate an NMR pulse sequence comprising a Carr-Purcell-Meiboom-Gill (CPMG) sequence, an inversion recovery sequence, or a spin-echo pulse sequence, wherein one or more excitation pulses associated with the NMR pulse sequence are generated via the second antenna of the NMR tool; and measure the sequence of waveforms via the first antenna of the NMR tool.

Aspect 18. The system of any of Aspects 10 to 17, wherein determining a spectrum associated with a sample based on an inversion on the converted echo values comprises: transforming, using a transform, the corrected echo value and the set of echo values before or after the conversion from a first domain to a second domain, wherein the first domain comprises the time domain and wherein the second domain comprises a longitudinal relaxation (T1) domain, a transverse relaxation (T2) domain, a T1-T2 domain, a T1-Diffusion (D) domain, a T2-D domain, or a T1-T2-D domain; and generating spectrum coefficients for values in the second domain based on the transforming of the corrected echo value and the set of echo values before or after the conversion from the first domain to the second domain.

Aspect 19. A non-transitory computer-readable storage medium having stored thereon instructions which, when executed by a system, cause the system to: obtain a sequence of waveforms via a nuclear magnetic resonance (NMR) tool in a borehole, the sequence of waveforms comprising a set of echo waveforms associated with refocusing pulses generated by the NMR tool and a free induction decay (FID) waveform associated with an excitation pulse generated by the NMR tool; determine a set of echo values based on the set of echo waveforms; determine an apparent time-zero echo value based on the FID waveform, the apparent time-zero echo value representing an echo at time zero of a time domain and the set of echo values representing echoes along a set of times after time zero of the time domain; apply a correction factor to the apparent time-zero echo value to yield a corrected time zero echo value; and based on one or more conversion factors, convert the corrected time zero echo value and the set of echo values to porosity units to yield converted echo values in porosity units; and determine a spectrum associated with a sample based on an inversion performed on the corrected time zero echo values and the set of echo values before or after a conversion of the corrected time zero echo value and the set of echo values to porosity units, the conversion of the corrected time zero echo value and the set of echo values being based on one or more conversion factors.

Aspect 20. The non-transitory computer-readable storage medium of Aspect 19, wherein the excitation pulse is generated via a first antenna of the NMR tool and the FID waveform is measured via a second antenna of the NMR tool.

What is claimed is:
1. A method comprising:
obtaining a sequence of waveforms via a nuclear magnetic resonance (NMR) tool in a borehole, the sequence of waveforms comprising a set of echo waveforms associated with refocusing pulses generated by the NMR tool and a free induction decay (FID) waveform associated with an excitation pulse generated by the NMR tool;
determining a set of echo values based on the set of echo waveforms;
determining an apparent time-zero echo value based on the FID waveform, the apparent time-zero echo value representing an echo at time zero of a time domain and the set of echo values representing echoes along a set of times after time zero of the time domain;
applying a correction factor to the apparent time-zero echo value to yield a corrected time zero echo value; and
determining a spectrum associated with a sample based on an inversion performed on the corrected time zero echo values and the set of echo values before or after a conversion of the corrected time zero echo value and the set of echo values to porosity units, the conversion of the corrected time zero echo value and the set of echo values being based on one or more conversion factors.
2. The method of claim 1, wherein determining the apparent time-zero echo value comprises deconvoluting the FID waveform and summing components of the FID waveform extracted via the deconvoluting of the FID waveform.
3. The method of claim 1, wherein the FID waveform represents a half echo generated after the excitation pulse, and wherein determining the apparent time-zero echo value comprises constructing a full echo corresponding to time zero of the time domain based on the half echo.
4. The method of claim 3, wherein determining the apparent time-zero echo value comprises:
determining the full echo based on at least one of a symmetric relationship between the FID waveform associated with the excitation pulse and an echo FID associated with the full echo, and one or more frequencies within the FID waveform.

5. The method of claim 1, further comprising:
comparing the apparent time-zero echo value with a projected time zero echo value along a decay curve, wherein the decay curve is generated based on a portion of the set of echo values, the portion of the set of echo values excluding a time one echo value representing a first echo at time one of the time domain and a time two echo value representing a second echo at time two of the time domain; and
based on the comparing of the apparent time-zero echo value with the projected time zero echo value along the decay curve, determining the correction factor applied to the apparent time-zero echo value.

6. The method of claim 5, further comprising:
comparing the corrected echo value or the projected time zero echo value with a predetermined porosity value of a sample; and
determining the one or more conversion factors based on the comparing of the corrected echo value or the projected time zero echo value with the predetermined porosity value of the sample.

7. The method of claim 1, further comprising: determining petrophysical quantities associated with the sample based on the spectrum.

8. The method of claim 1, further comprising:
generating, via the NMR tool, an NMR pulse sequence comprising a Carr-Purcell-Meiboom-Gill (CPMG) sequence, an inversion recovery sequence, or a spin-echo pulse sequence, wherein one or more excitation pulses associated with the NMR pulse sequence are generated via a first antenna of the NMR tool; and
measuring the sequence of waveforms via the NMR tool, wherein echo waveforms from the sequence of waveforms are measured via at least one of the first antenna and a second antenna of the NMR tool.

9. The method of claim 1, wherein determining a spectrum associated with a sample based on the inversion comprises:
transforming, using a transform, the corrected echo value and the set of echo values before or after the conversion from a first domain to a second domain, wherein the first domain comprises the time domain and wherein the second domain comprises a longitudinal relaxation (T1) domain, a transverse relaxation (T2) domain, a T1-T2 domain, a T1-Diffusion (D) domain, a T2-D domain, or a T1-T2-D domain; and
generating spectrum coefficients for values in the second domain based on the transforming of the corrected echo value and the set of echo values before or after the conversion from the first domain to the second domain.

10. The system of claim 1, wherein the one or more processors are configured to:
compare the corrected echo value with a predetermined porosity value of a sample; and
determine the one or more conversion factors based on the comparing of the corrected echo value with the predetermined porosity value of the sample.

11. A system comprising:
a nuclear magnetic resonance (NMR) tool comprising a magnet and two or more antennas, the NMR tool configured to measure a sequence of NMR waveforms associated with a sample in a borehole, the sequence of NMR waveforms comprising a free induction decay (FID) waveform measured by a first antenna of the two or more antennas after an excitation pulse generated by a second antenna of the two or more antennas and a set of echo waveforms associated with refocusing pulses generated by at least one of the two or more antennas; and
one or more processors coupled to a memory, the one or more processors configured to:
determine a set of echo values based on the set of echo waveforms;
determine an apparent time-zero echo value based on the FID waveform, the apparent time-zero echo value representing an echo at time zero of a time domain and the set of echo values representing echoes along a set of times after time zero of the time domain;
apply a correction factor to the apparent time-zero echo value to yield a corrected time zero echo value; and
determine a spectrum associated with a sample based on an inversion performed on the corrected echo value and the set of echo values before or after a conversion of the corrected time zero echo value and the set of echo values to porosity units, the conversion of the corrected time zero echo value and the set of echo values being based on one or more conversion factors.

12. The system of claim 11, wherein determining the apparent time-zero echo value comprises deconvoluting the FID waveform and adding components of the FID waveform extracted via the deconvoluting of the FID waveform.

13. The system of claim 11, wherein the FID waveform represents a half echo generated after the excitation pulse, and wherein determining the apparent time-zero echo value comprises determining a full echo corresponding to time zero of the time domain based on the half echo.

14. The system of claim 13, wherein determining the apparent time-zero echo value comprises:
determining the full echo based on at least one of a symmetric relationship between the FID waveform associated with the excitation pulse and an echo FID associated with the full echo, and one or more frequencies within the FID waveform.

15. The system of claim 11, wherein the one or more processors are configured to:
compare the apparent time-zero echo value with a projected time zero echo value along a decay curve, wherein the decay curve is generated based on a portion of the set of echo values, the portion of the set of echo values excluding a time one echo value representing a first echo at time one of the time domain and a time two echo value representing a second echo at time two of the time domain; and
based on the comparing of the apparent time-zero echo value with the projected time zero echo value along the decay curve, determine the correction factor.

16. The system of claim 11, wherein the one or more processors are configured to determine petrophysical quantities associated with the sample based on the spectrum.

17. The system of claim 11, wherein the NMR tool is configured to:
generate an NMR pulse sequence comprising a Carr-Purcell-Meiboom-Gill (CPMG) sequence, an inversion recovery sequence, or a spin-echo pulse sequence, wherein one or more excitation pulses associated with the NMR pulse sequence are generated via the second antenna of the NMR tool; and
measure the sequence of waveforms via the first antenna of the NMR tool.

18. The system of claim 11, wherein determining a spectrum associated with a sample based on an inversion on the converted echo values comprises:

transforming, using a transform, the corrected echo value and the set of echo values before or after the conversion from a first domain to a second domain, wherein the first domain comprises the time domain and wherein the second domain comprises a longitudinal relaxation (T1) domain, a transverse relaxation (T2) domain, a T1-T2 domain, a T1-Diffusion (D) domain, a T2-D domain, or a T1-T2-D domain; and generating spectrum coefficients for values in the second domain based on the transforming of the corrected echo value and the set of echo values before or after the conversion from the first domain to the second domain.

19. A non-transitory computer-readable storage medium having stored thereon instructions which, when executed by a system, cause the system to:

obtain a sequence of waveforms via a nuclear magnetic resonance (NMR) tool in a borehole, the sequence of waveforms comprising a set of echo waveforms associated with refocusing pulses generated by the NMR tool and a free induction decay (FID) waveform associated with an excitation pulse generated by the NMR tool;

determine a set of echo values based on the set of echo waveforms;

38 determine an apparent time-zero echo value based on the FID waveform, the apparent time-zero echo value representing an echo at time zero of a time domain and the set of echo values representing echoes along a set of times after time zero of the time domain;

apply a correction factor to the apparent time-zero echo value to yield a corrected time zero echo value; and based on one or more conversion factors, convert the corrected time zero echo value and the set of echo values to porosity units to yield converted echo values in porosity units; and determine a spectrum associated with a sample based on an inversion performed on the corrected time zero echo values and the set of echo values before or after a conversion of the corrected time zero echo value and the set of echo values to porosity units, the conversion of the corrected time zero echo value and the set of echo values being based on one or more conversion factors.

20. The non-transitory computer-readable storage medium of claim 19, wherein the excitation pulse is generated via a first antenna of the NMR tool and the FID waveform is measured via a second antenna of the NMR tool.

* * * * *